US007840443B2

(12) United States Patent
Lukis et al.

(10) Patent No.: US 7,840,443 B2
(45) Date of Patent: *Nov. 23, 2010

(54) AUTOMATED QUOTING OF CNC MACHINED CUSTOM MOLDS AND/OR CUSTOM PARTS

(75) Inventors: Lawrence J. Lukis, Wayzata, MN (US); Christopher Walls-Manning, Ramsey, MN (US); Mark R. Kubicek, Lakeville, MN (US)

(73) Assignee: Proto Labs, Inc., Maple Plain, MN (US)

( * ) Notice: Subject to any disclaimer, the term of this patent is extended or adjusted under 35 U.S.C. 154(b) by 1049 days.

This patent is subject to a terminal disclaimer.

(21) Appl. No.: 11/586,379

(22) Filed: Oct. 25, 2006

(65) Prior Publication Data
US 2007/0038531 A1 Feb. 15, 2007

Related U.S. Application Data

(63) Continuation-in-part of application No. 11/035,648, filed on Jan. 14, 2005, now Pat. No. 7,496,528, which is a continuation-in-part of application No. 10/970,130, filed on Oct. 21, 2004, now Pat. No. 7,590,466, which is a continuation of application No. 10/325,286, filed on Dec. 19, 2002, now Pat. No. 6,836,699, which is a continuation-in-part of application No. 10/056,755, filed on Jan. 24, 2002, now Pat. No. 6,701,200.

(60) Provisional application No. 60/344,187, filed on Dec. 27, 2001, provisional application No. 60/386,658, filed on Jun. 5, 2002.

(51) Int. Cl.
*G06Q 30/00* (2006.01)
(52) U.S. Cl. ................. 705/26; 705/27; 700/97
(58) Field of Classification Search ............ 705/26, 705/27; 700/97
See application file for complete search history.

(56) References Cited

U.S. PATENT DOCUMENTS 4,641,270 A   2/1987   Lalloz et al. ............ 364/476

(Continued)

FOREIGN PATENT DOCUMENTS

JP        09-160945        6/1997

(Continued)

OTHER PUBLICATIONS

Press release, "Quickparts.com Announces the Release of QuickQuoteTM Rev 2.o Instant Online Quoting Engine"; Atlanta GA., Mar. 5, 2001; received in the IDS filed on Feb. 4, 2005 in the applicant's U.S. Appl. No. 11/035,648.*

(Continued)

*Primary Examiner*—Yogesh C Garg
(74) *Attorney, Agent, or Firm*—Shewchuk IP Services, LLC; Jeffrey D. Shewchuk

(57) ABSTRACT

A customer sends a CAD file for the part to be manufactured to the system. The system assesses the CAD file to determine various pieces of manufacturing information. One or more acceptability criteria are applied to the part, such as whether the part can be machined in two opposing orientations in a 3 axis CNC machine. If not, the system sends a file to the customer graphically indicating which portions of the part need modification to be manufacturable. The system provides the customer with a quotation form, that allows the customer to select several parameters, such as number of cavities or parts per workpiece block, surface finish and material, which are independent of the shape of the part. The quotation module then provides the customer with the cost to manufacture the mold or a number of parts, which may include both molded parts and total profiled machined parts. Budget-driven quotation is possible, wherein proposed modifications in the molding process are controlled by the budget of the customer. Interactivity is also achieved, with the customer being able to modify the quotation interactively by modifying one or more of the initially selected parameters, including selecting a different budgeted amount.

15 Claims, 18 Drawing Sheets

U.S. PATENT DOCUMENTS

| | | | | |
|---|---|---|---|---|
| 5,189,626 | A | 2/1993 | Colburn | 364/474.24 |
| 5,458,825 | A | 10/1995 | Grolman et al. | 264/401 |
| 5,570,292 | A | 10/1996 | Abraham et al. | |
| 5,641,448 | A | 6/1997 | Yeung et al. | 264/401 |
| 5,838,328 | A | 11/1998 | Roller | 345/420 |
| 6,012,883 | A | 1/2000 | Engwall et al. | |
| 6,096,088 | A | 8/2000 | Yu et al. | 703/9 |
| 6,116,888 | A | 9/2000 | Johnston et al. | 425/195 |
| 6,175,422 | B1 | 1/2001 | Penn et al. | 358/1.1 |
| 6,219,055 | B1 | 4/2001 | Bhargava et al. | 700/99 |
| 6,675,055 | B1* | 1/2004 | Fischer | 700/97 |
| 6,688,871 | B1 | 2/2004 | Lee et al. | |
| 6,836,699 | B2* | 12/2004 | Lukis et al. | 700/200 |
| 7,305,367 | B1 | 12/2007 | Hollis et al. | |
| 2002/0035450 | A1 | 3/2002 | Thackston | |
| 2004/0098292 | A1 | 5/2004 | Miller et al. | |

FOREIGN PATENT DOCUMENTS

| | | |
|---|---|---|
| WO | WO 01/15850 A2 | 3/2001 |
| WO | WO01/77781 A2 | 10/2001 |
| WO | WO01/82519 A2 | 11/2001 |

OTHER PUBLICATIONS

The Protomold Company, Inc./Protomold Pamphlet, 2 pages.
Quickparts.com press release, "Quickparts.com Announces Next Day Service for SLA Rapid Prototypes", Sep. 23, 2002.
Quickparts.com press release, "Quickparts.com Announces the Release of Online Instantaneous Quotes for WaterClearTM and High Resolution Prototypes", Nov. 23, 2001.
Quickparts.com press release, "Quickparts.com Announces the Release of Online Instantaneous Quotes for Cast Urethane Production Prototypes", Jul. 16, 2001.
Quickparts.com press release, "Quickparts.com Announces the Release of PolyQuote 1.0 Instant Quoting Technology for Build-To-Order Polyurethane Castings", May 14, 2001.
Quickparts.com press release, "Quickparts.com Announces the Release of QuickQuote™ Rev 2.0 Instant Online Quoting Engine", Mar. 5, 2001.
ASPire3D and Quickparts.com Announce Strategic Partnership, Jan. 2, 2001.
Quickparts.com press release, "Quickparts.com Announces the Release of "MyQuote" Instant Quoting Application", Oct. 16, 2000.
Quickparts.com press release, "Quickparts.com Completes Expansion to New Atlanta Facility", Jul. 7, 2000.
Quickparts.com press release, "Quickparts.com Expands On-line Instant Quoting to Include Investment Casting Patterns for the Low-Volume Custom Manufactured Metal Part Market", Apr. 11, 2000.
Quickparts.com press release, "Quickparts.com Surpasses 1000 On-line Quotes, $1 Million Quoted, in First 3 Months of Operation", Apr. 11, 2000.
Quickparts.com press release, "QuickQuote™ Automates RP Quoting", Jan. 10, 2000.
Quickparts.com press release, "Quickparts.com Announces the Launch of the First Web-Based E-Commerce System for Instant Quoting and Procurement of Rapid Prototyping Parts", Jan. 3, 2000.
Quickparts.com press release, "Quickparts.com Announces the Pre-Release of the First Web-Based E-Commerce System for Instant Quoting and Procurement of Rapid Prototyping Parts", Dec. 15, 1999.
Quickparts.com press release, "Quickparts Launches QuickTool Express™, Instant Online Quotes for QuickTurn Injection Molded Parts", Jan. 10, 2005.
Quickparts.com press release, Quickparts Makes Inc. 500 List of Fastest Growing Private Companies, Nov. 9, 2004.
Quickparts.com press release, "Quickparts Named to Entrepreneur Magazine's Hot 100 Fastest Growing Entrepreneurial Companies", Jun. 10, 2004.
Quickparts.com press release, "Quickparts Offers New 'MultiQuote' Option for Rapid Prototypes & Cast Urethanes", May 10, 2004.
Quickparts.com press release, "Quickparts Offers New Real-Time Order Status and Shipment Tracking for Rapid Prototypes", Apr. 6, 2004.
Quickparts.com press release, "Quickparts.com Offers New ABS-like Stereolithography Material for Rapid Prototyping", Feb. 5, 2004.
Quickparts.com press release, "Quickparts.com Joins Solid Edge Voyager Program with MyQuote Instant Quoting Application", Oct. 16, 2003.
Quickparts.com press release, "QuickQuote Add-In for Autodesk Inventor Certified for Autodesk Inventor 6.0 and 7.0", Sep. 9, 2003.
Quickparts.com press release, "Quickparts.com Announces the Release of QuickQuote Add-in for Autodesk Inventor", Jun. 26, 2003.
Quickparts.com press release, "Resinate and Quickparts.com Announce Strategic Alliance.", Apr. 8, 2003.
Sarma, Sanjay E., Reference Free Part Encapsulation: A New Universal Fixturing Concept, Journal of Manufacturing Systems, 1997.
Frank, Matthew C., Rapid Planning for CNC Milling—A New Approach for Rapid Prototyping, Journal of Manufacturing Systems, 2004.
Smith, Charles S. III, CyberCut: A World Wide Web Based Design-To-Fabrication Tool, Journal of Manufacturing Systems, 1996.
Ahn, Sung H., Reference Free Part Encapsulation (RFPE): An Investigation of Material Properties and the Role of RFPE in a Taxonomy of Fixturing Systems, J. Mfg. Sys., 2002.
Sarma, Sanjay et al., Design of an Autonomous Fixturing System Using RFPE Techniques, OE Reports, Oct. 1997.
Guevara, Ceani, Development of the Process Parameter Map for Reference Free Part Encapsulation, M.I.T. M.S.M.E. Thesis, Jun. 2001.
Won, Jey et al., "Rapid Prototyping of Robotic Systems", Robotics and Automation, 2000 Proceedings ICRA '00 IEEE International Conference on, vol. 4, p. 3077-3082, www.coe.neu.edu/Research/robots/papers/IEEE_RP.PDF.

* cited by examiner

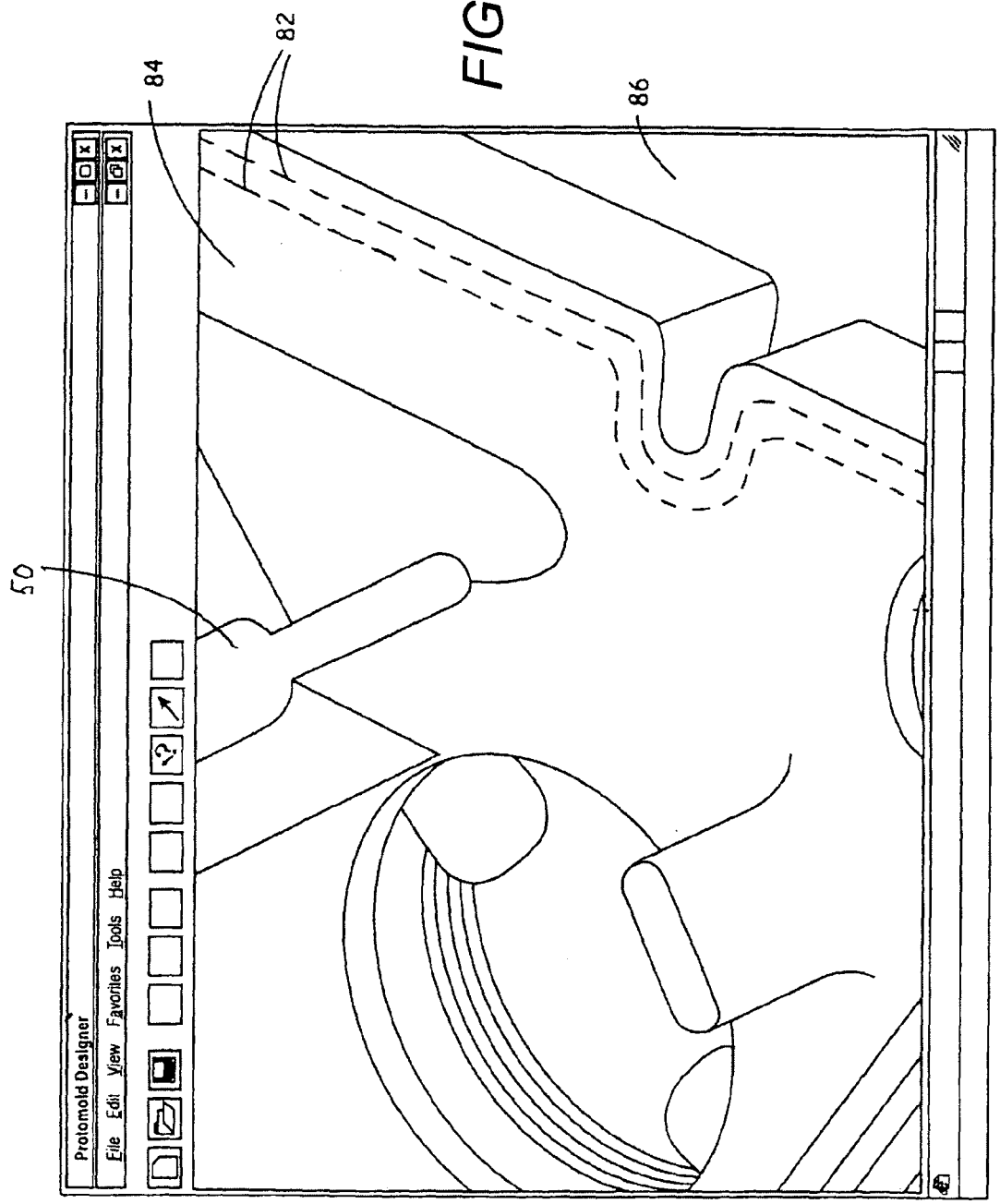

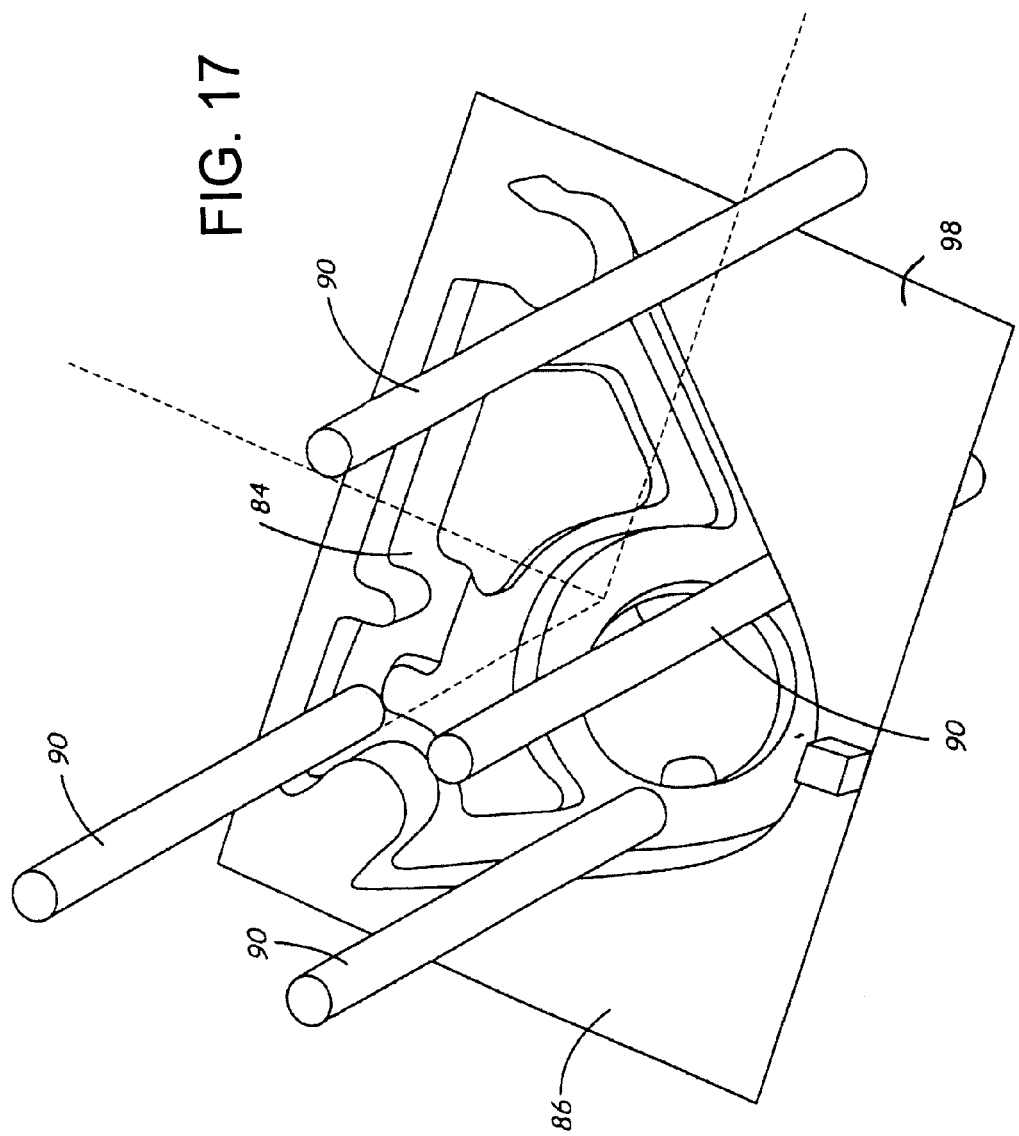

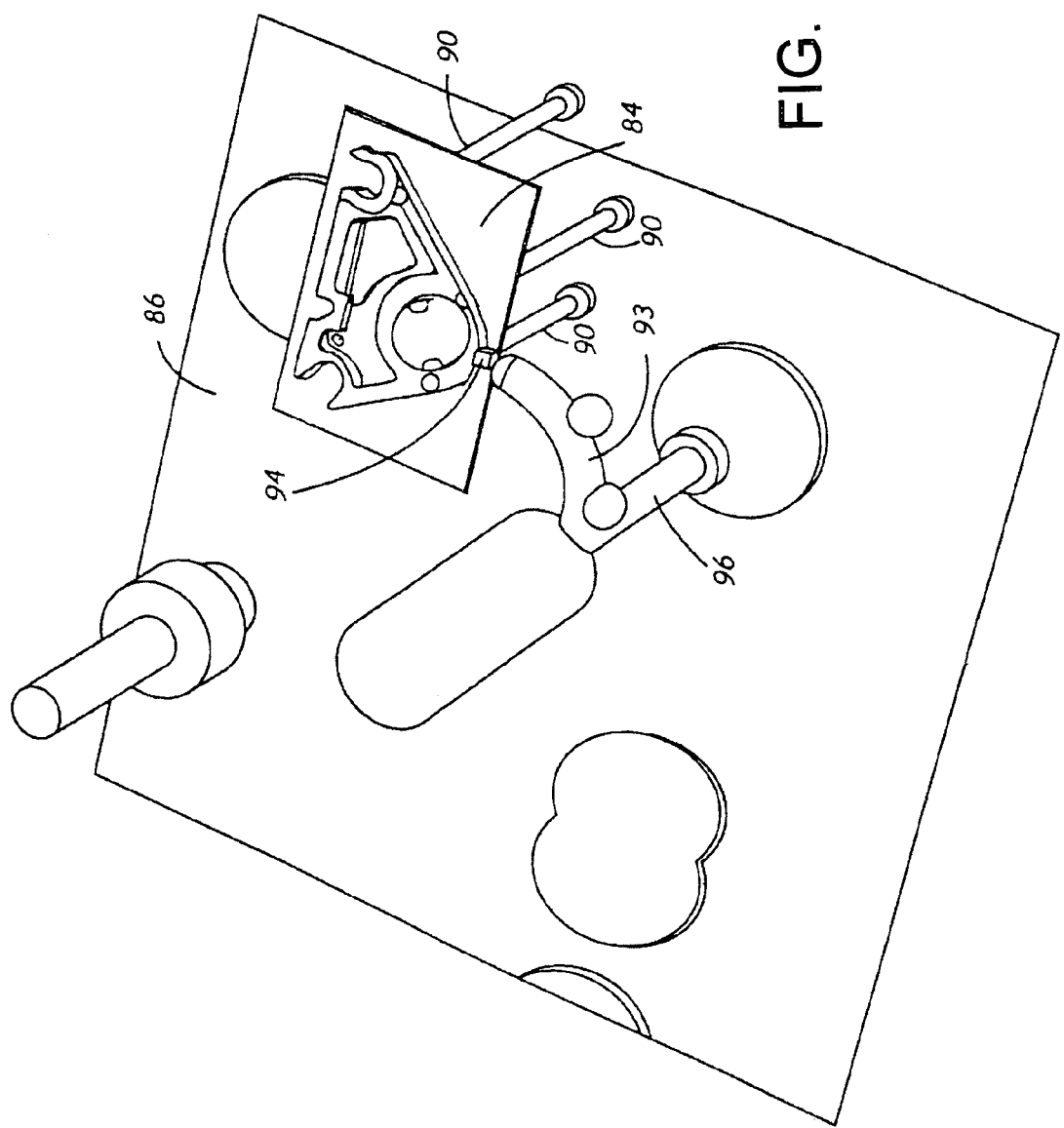

AUTOMATED QUOTING OF CNC MACHINED CUSTOM MOLDS AND/OR CUSTOM PARTS

CROSS-REFERENCE TO RELATED APPLICATION(S)

The present application is a continuation-in-part of application Ser. No. 11/035,648, filed Jan. 14, 2005 and entitled AUTOMATED QUOTING OF MOLDS AND MOLDED PARTS, incorporated by reference herein, which is a continuation-in-part of application Ser. No. 10/970,130, filed Oct. 21, 2004 and entitled AUTOMATED QUOTING OF MOLDS AND MOLDED PARTS, incorporated by reference herein, which is a continuation of application Ser. No. 10/325,286, filed Dec. 19, 2002 and entitled AUTOMATED QUOTING OF MOLDS AND MOLDED PARTS, now issued as U.S. Pat. No. 6,836,699, incorporated by reference herein, which is a continuation-in-part of U.S. patent application Ser. No. 10/056,755 of Lawrence J. Lukis et al., filed Jan. 24, 2002, entitled AUTOMATED CUSTOM MOLD MANUFACTURE, now issued as U.S. Pat. No. 6,701,200, incorporated by reference herein, which claims priority from provisional patent application 60/344,187, filed Dec. 27, 2001, entitled AUTOMATED MANUFACTURE OF STRAIGHT PULL MOLDS FOR CUSTOM PLASTIC PARTS. This application also claims priority (through application Ser. No. 10/325,286) from provisional patent application 60/386,658 of Lawrence J. Lukis et al., filed Jun. 5, 2002, entitled IMPROVED PROTOTYPE QUOTING.

BACKGROUND OF THE INVENTION

The present invention relates to the field of custom part making, and particularly to the manufacture of custom parts which involve a CNC machining operation based upon a CAD file provided by the customer. Such parts include parts which are made from CNC machined molds, such as for use with injection molding presses, from blocks of metal, and parts which are directly CNC machined from blocks of workpiece material. More specifically, the present invention relates to software supported methods, systems and tools used in the design and fabrication of such custom plastic parts formed utilizing a CNC machining operation, and in presenting information to customers for the customer to have selective input into various aspects of such design and fabrication which affect price of a customized part profile.

Injection molding, among other types of molding techniques, is commonly utilized to produce plastic parts from molds. Once the injection mold is created and the injection mold press is properly set up, injection molding can quickly create parts of complex geometries in quick succession to reach high-volume runs. Companies and individuals engaged in fabricating molds are commonly referred to as "moldmakers." In many cases (referred to as "straight pull" injection molding), the mold consists of two metal blocks, one top and one bottom. Most commonly, the metal blocks are high quality machine steel, so the mold will have an acceptably long life. Opposed surfaces of each mold block are machined to jointly produce the required cavity in the shape of the desired part, as well as "shut-off" surfaces sealing the cavity when the mold blocks are pressed together. The line on which shut-off surfaces intersect with the surface of the cavity is called the parting line. The corresponding line on the surface of the part formed by the parting line is called the witness mark. After the mold assembly is set up in an injection molding press, parts are made by filling the cavity with molten plastic. The mold blocks are separated from each other after solidification of the molten plastic. The plastic part, normally sticking after separation to the bottom block, is then ejected by means of ejectors.

The moldmaking art has a long history of fairly gradual innovation and advancement. Molds are designed pursuant to a specification of the part geometry provided by a customer; in many cases, functional aspects of the plastic part also need to be taken into account. Historically, moldmaking involves at least one face-to-face meeting between the moldmaker and the customer, in which the customer submits detailed part geometry, usually with the aid of drawings, to the moldmaker and outlines the function of the part. Armed with knowledge of injection molding technology, the moldmaker designs the mold corresponding to the drawings of the part. In particular, the moldmaker orients the part to enable a straight pull mold separation, splits its surface into two areas separated by a suitable parting line, and replicates these areas in the top and bottom blocks. The moldmaker determines the location and shape of the shut-off surfaces and enlarges the dimensions of the cavity relative to the desired part as necessary to account for shrinkage of the plastic material. The moldmaker determines the size and position of one or more gates and runners to provide an adequate flow path for the molten plastic shot into the cavity. Sizes and locations of openings for ejection pins are also selected by the moldmaker. The machining operations to be performed to fabricate the designed mold are determined by the moldmaker. The moldmaker then runs various cutting tools, such as endmills, drills and reams, to machine the basic cavity, shut-off surfaces, runners, gates and ejector pin openings in blocks of metal. To produce certain hard-to-mill features in the mold, the moldmaker may also design and machine electrodes, and then perform electro-discharge machining ("EDM") of the mold blocks. The moldmaker then outfits the mold blocks with ejection pins and prepares the mold assembly for use in the injection molding press. Throughout all of this design and fabrication, the moldmaker makes numerous design choices pertaining to the geometric details of the cavities to be machined as well as to the tools to be used for machining.

Beyond using machining to form an injection mold, machining has long been used to directly shape metal, wood, plastic and similar solid materials into parts. Machining involves a subtractive process, wherein material is reamed, drilled, sawed, lathed, cut in chips or similarly removed from a larger solid block which is held or fixtured in to the tool. CNC machining has accelerated the machining process and become commonplace in many part making and machine shops. CNC machining requires the writing of code instructing the CNC machine which tools and tool paths are needed for the material removal steps. Just as when CNC machining is used to machine a mold block, the process for generating CNC tool paths to directly machine a part can be simple or difficult depending upon the complexity of the tool paths. For simple profiles, typically having a rectangular or box-like shape which can be readily held with vices on the CNC machine, CNC machining may be a viable option, either in low-, mid- or high-volume runs. As part shape profiles and geometries are designed to be more complicated, CNC machining often requires the creation of custom fixtures for holding the part during machining. It is not unusual for the design and fabrication of the custom fixturing to involve more time and expense than the design and fabrication of a single part. With the added time and complexity associated with custom fixturing, CNC machining is rarely used for low-volumes of parts having more complex shapes which need to be fabricated in a quick turn-around time. For parts in mid- or high-volume runs, the design and fabrication of custom fixtures may be warranted, making machining again a viable option depending upon part shape. Even with custom fixturing, if the machining time for the part takes too long, often other methods of part manufacture will be more cost effective than "total profile" machining, i.e., machining a substantial majority of the surface area of the part in the CNC machine.

Regardless of whether a mold is formed or a part is directly machined, all these steps involve a high degree of skill and experience on the part of the moldmaker and/or machinist. Experienced moldmakers and/or machinists, after having considered the design submitted by the customer, may sometimes suggest changes to the part geometry so that the part is more manufacturable and less costly. Highly experienced, gifted moldmakers and machinists can charge a premium for their services, both in return for the acuity of their experience and perception in knowing what will and will not work in the mold, and in return for their skill, speed and craftsmanship in machining the mold or directly machining the part.

Because of the large number of technical decisions involved and considerable time spent by highly skilled moldmakers in analyzing in detail the part geometry by visual inspection, obtaining a desired injection mold has generally been quite expensive and involved a significant time delay. A single mold may cost tens or hundreds of thousands of dollars, and delivery times of eight to twelve weeks or more are common. While often not quite as time consuming or costly as machining a mold, obtaining even a single part from a highly skilled machinist can also involve great expense and significant time delay.

As in many other areas of industry, various computer advances have been applied to the moldmaking and machining arts. Today, most of customer's drawings are not prepared by hand, but rather through commercially available programs referred to as CAD (Computer-Aided Design) software. To produce drawings of the molds based on the drawings of custom parts, moldmakers also use CAD software, including packages developed specifically for this task. Also, in most moldmaking companies and in many machining companies, machining operations are not manually controlled. Instead, CNC (Computer Numerical Control) machines such as vertical mills are used to manufacture parts, molds and/or EDM electrodes in accordance with a set of CNC instructions. To compute detailed toolpaths for the tools assigned by the moldmaker or machinist and to produce long sequences of such instructions for CNC mills, computers running CAM (Computer-Aided Manufacturing) software (again, including some packages developed specifically for the moldmaking industry) are used by many moldmakers and machinists. CAD/CAM software packages are built around geometry kernels—computationally intensive software implementing numerical algorithms to solve a broad set of mathematical problems associated with analysis of geometrical and topological properties of three-dimensional (3D) objects, such as faces and edges of 3D bodies, as well as with generation of new, derivative 3D objects. At present, a number of mature and powerful geometry kernels are commercially available.

While existing CAD/CAM software packages allow designers and CNC machinists to work with geometrically complex parts, they are still far from completely automating the designer's work. Rather, these packages provide an assortment of software-supported operations that automate many partial tasks but still require that numerous decisions be made by the user to create the design and generate machining instructions. CAD/CAM packages usually facilitate such decisions by means of interactive visualization of the design geometry and machining tools. This makes software applicable to a wide variety of tasks involving mechanical design and machining operations. The downside of such versatility, when applied to moldmaking and machining, is that it results in long and labor intensive working sessions to produce mold designs and CNC machining instructions for many custom parts, including parts lending themselves to straight pull molding.

Visualization allows the moldmaker to evaluate whether the mold and injection molded parts can be made sufficiently close to the design using available tools. The fidelity with which plastic parts can be manufactured is limited by the finite precision of mills and cutting tools used to machine the part or the mold. The fidelity with which plastic parts can be molded may be further limited by the shrinkage of plastic materials (slightly changing the shape and dimensions of the injection molded parts as they cool down and undergo stress relaxation in a way that is largely but not entirely predictable). These rather generic factors establish the level of dimensional tolerances for directly machined or injection-molded parts, the level that is generally known and in most cases acceptable to the customers.

Oftentimes, however, additional factors come into play that can result in more significant deviations of injection molded plastic parts or directly machined parts from the submitted design geometry. These factors are usually associated with certain features that are hard to machine using vertical mills. For example, very thin ribs in a molded part can be made by cutting deep and narrow grooves in the mold, but may require an endmill with an impractically large length to diameter ratio. Machining deep and narrow grooves directly in the part may similarly require an endmill with an impractically large length to diameter ratio. Machining of angles between adjacent faces joined by small radius fillets (and, especially, of angles left without a fillet) may result in similar difficulties. Exact rendering of such features may substantially increase the cost of the part or the mold, and even make its fabrication impractical with the technology available to the moldmaker/machinist.

Obviously, such manufacturability issues need to be identified, communicated to the customer, and, if necessary, rectified before proceeding with mold or part fabrication. Their resolution normally requires tight interaction between the moldmaker/machinist and the customer, as both parties are in possession of complementary pieces of information needed to resolve the issues. The moldmaker/machinist has first hand knowledge of the mold/part fabrication technology available to him, while the customer, usually represented in this process by the part designer, has first hand understanding of part functionality and cosmetic requirements. Based on this understanding, the customer can either agree to the anticipated deviations of part geometry from the submitted specification, or, if the deviations are unacceptable, the customer can modify the part design to resolve manufacturability issues without compromising functional and cosmetic aspects of the design.

As custom parts often have many unnamed (and hard to name) features, pure verbal communication not supported by visualization of the part can be awkward and misleading. Therefore, communicating such information requires a face-to-face meeting with the customer, in which the moldmaker/machinist and the customer view the drawing or image of the part and discuss the issues in detail. Such meetings take a considerable amount of time, both for moldmakers/machinists and their customers, and increase business costs.

Resolution of manufacturability issues is closely connected with price quotations requested by customers. When a customer requests a price quotation for a directly machined part or a molding project, the machinist/moldmaker informally applies a wealth of experience and knowledge to predict costs and various difficulties in fabricating the part or the mold. The potential manufacturability issues should be substantially resolved before a binding quotation can be given to a customer. For this reason, it can often take one or two weeks for a customer just to obtain a price quotation. Quoting is performed at a stage when securing the order for the job is uncertain, and the cost of quoting must be recovered by the moldmaker/machinist from the subset of quotes that are actually accepted.

In the event that the customer contracts with the moldmaker/machinist for the job, the quotation becomes a constituent part of the contract for manufacturing the part(s) and/or the mold. For obvious reasons the informal quoting method is prone to human errors. If the request for quotation results in the job order, such errors will most likely become apparent during part or mold design and machining, or even after the mold is finished and used for manufacturing the first plastic parts. The price of such mistakes in terms of the lost time and effort, as well as in terms of strained customer relations, may be rather high. Thus, for a moldmaking or machining business to be successful and profitable, good communication between the customer and the moldmaker/machinist in resolving manufacturability issues and accurate quoting are extremely important.

BRIEF SUMMARY OF THE INVENTION

The present invention is a method and system of automated, custom quotation for manufacture of a custom part and/or manufacture of a custom mold. To begin the process, a customer provides a CAD file defining the surface profile for the part to be formed to the system. The system assesses the part surface profile (which could have any of a virtually infinite number of shapes) to consider certain cost-affecting parameters determined by the part surface profile. A quotation is then generated which varies based the part surface profile information. In one aspect, The quotation is provided to the customer in a manner which achieves flexibility and interactivity, such as by providing an interactive graphical rendering of how the part changes at different quotation amounts.

BRIEF DESCRIPTION OF THE DRAWINGS

FIG. 16 is a computer screen shot of a perspective view showing the selected tool paths of the standard endmill of FIG. 11 in fabricating the mold for the exemplary part of FIG. 1.

FIG. 17 is a perspective view showing the parting line, the shut-off surfaces, and the ejection pin locations for the exemplary part of FIG. 1.

FIG. 18 is a perspective view showing sprues, runners, gates and ejection pins for the mold for the exemplary part of FIG. 1.

While the above-identified drawing figures set forth one or more preferred embodiments, other embodiments of the present invention are also contemplated, some of which are noted in the discussion. In all cases, this disclosure presents the illustrated embodiments of the present invention by way of representation and not limitation. Numerous other minor modifications and embodiments can be devised by those skilled in the art which fall within the scope and spirit of the principles of this invention.

DETAILED DESCRIPTION

Figure 1:
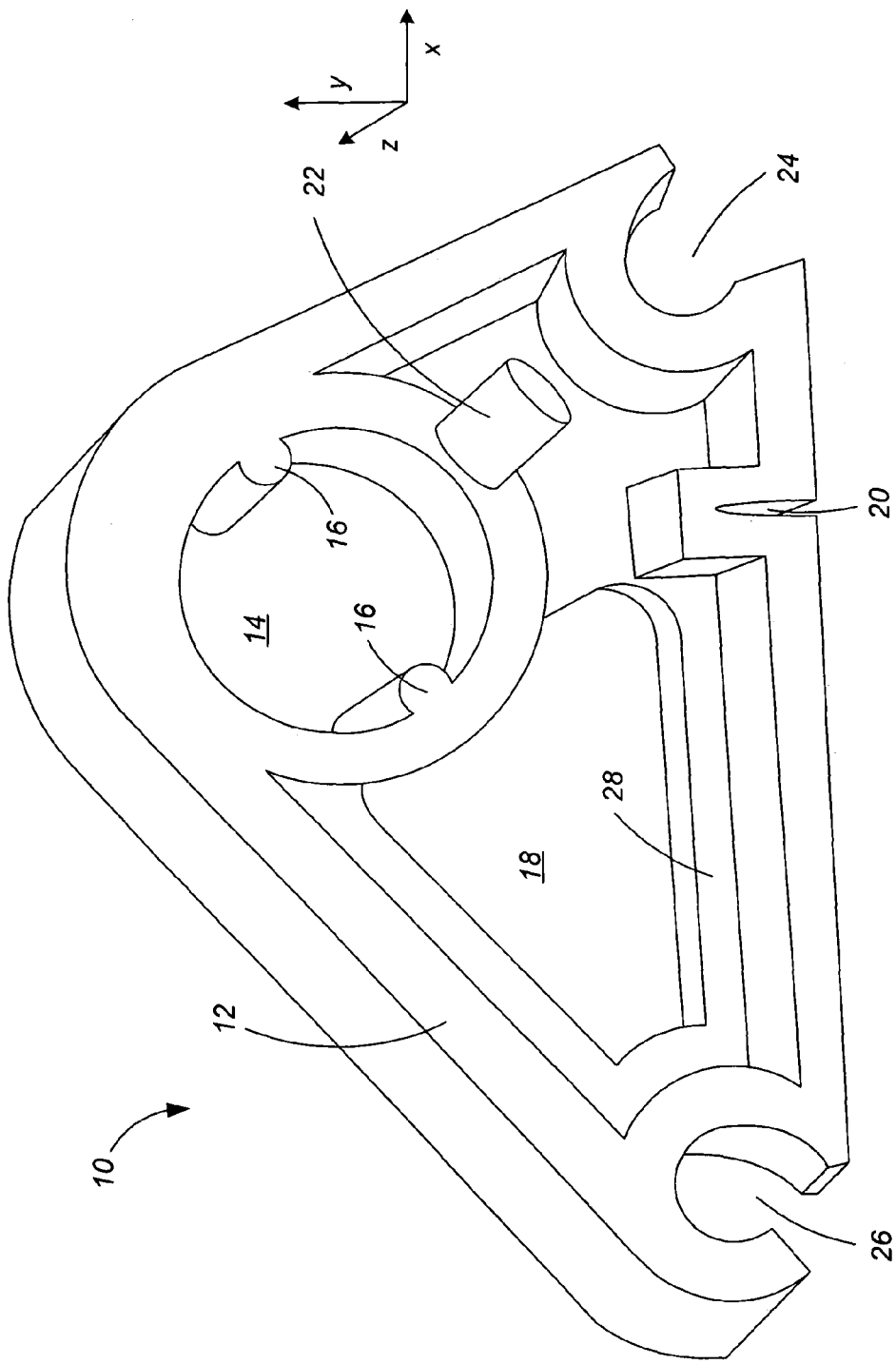
FIG. 1 is a perspective view of an exemplary "cam" part desired by a customer.

The present invention will be described with reference to an exemplary part 10 shown in FIG. 1. FIG. 1 represents a "cam" part 10 designed by the customer. In part because the cam 10 is custom-designed (i.e., not a staple article of commerce) by or for this particular customer, the cam 10 includes numerous features, none of which have commonly accepted names. For purposes of discussion, we will give names to several of these features, including a part outline flange 12, a circular opening 14 with two rotation pins 16, a non-circular opening 18, a notch 20, a rib 22, a 60° corner hole 24, a 30° corner hole 26, and a partial web 28. However, workers skilled in the art will appreciate that the customer may in fact have no name or may have a very different name for any of these features.

Figure 2:
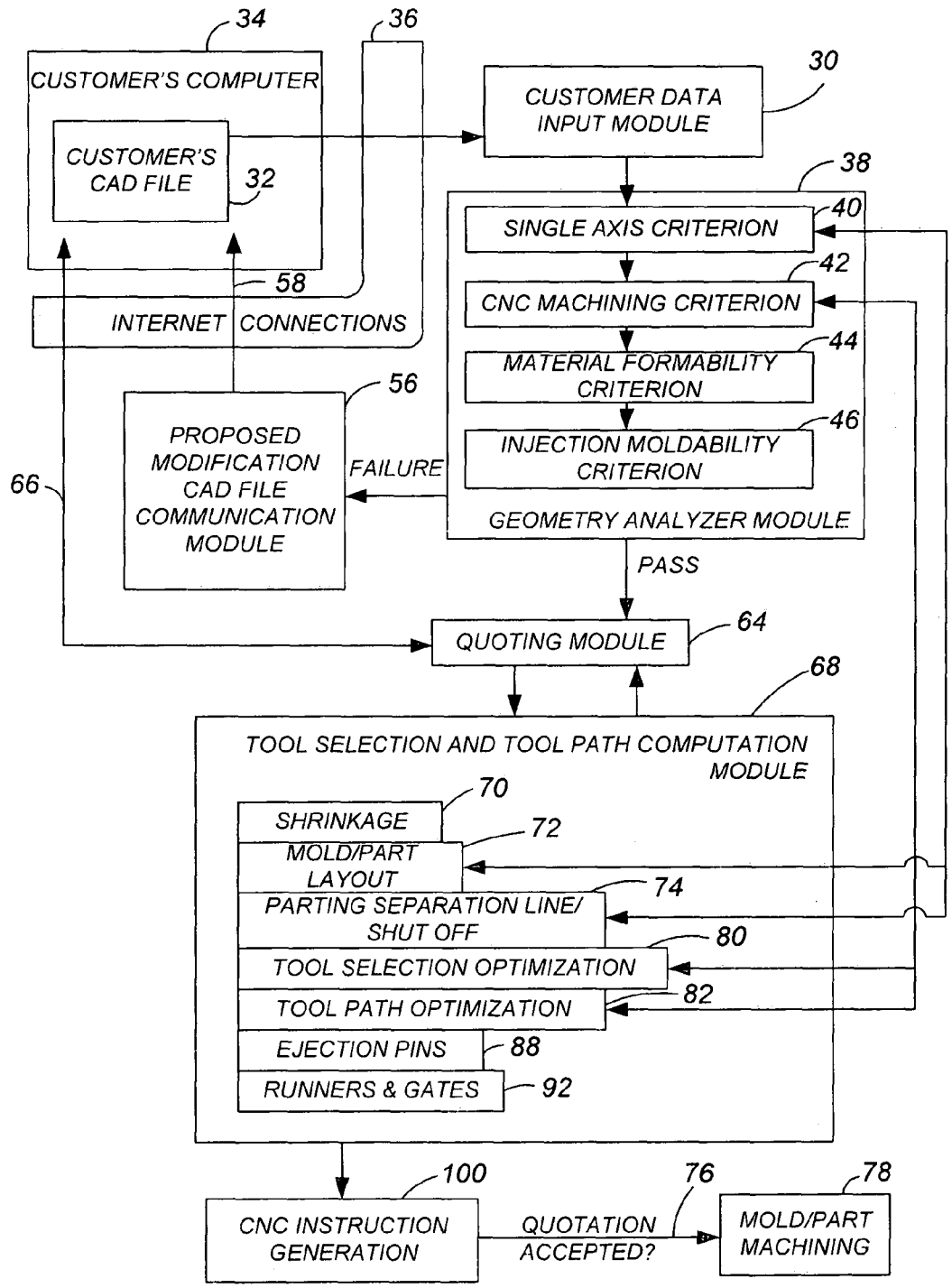
FIG. 2 is a flow diagram of the preferred method followed by the present invention to manufacture the mold for the exemplary "cam" part.

FIG. 2 is a flow chart showing how the present invention is used to manufacture the customer's part. The first step involves a Customer Data Input module 30. A starting input for the present invention is a CAD part design file 32, provided by the customer from the customer's computer 34. There are several standard exchange formats currently used in the 3D CAD industry. Presently the most widely used format is the Initial Graphics Exchange Specification (IGES) standard. The present invention accepts IGES, STL or various other formats, and is compatible with all the commercial CAD products currently in use.

In contrast to most moldmaker's or machinist's operations which involve an initial face-to-face meeting with the customer to discuss drawings, the present invention allows the customer to provide the CAD file 32 without a face-to-face meeting. Such communication could occur through a mailed computer disk or through a dial-up modem site. In particular, however, an address on a global communications network such as the internet 36 is configured to receive customer CAD files 32. While the address could be a simple e-mail address, the preferred address is a website on the world-wide-web, configured to receive a CAD file 32 from a customer for the part to be molded or machined. The "web-centric" customer interface preferably include a part submission page as part of the Customer Data Input module 30, which allows the customer to identify which standard CAD/CAM format is being used for the part drawings. Alternatively, the customer's CAD file 32 may be evaluated with an initial program which determines which type of standard CAD/CAM format is being used by the customer. If the CAD file 32 transmitted by the customer does not conform to a recognized standard CAD file format so as to be readable by the software of the present invention, the customer data input module returns an error message to the customer. As one example, the error message could be a simple e-mail advising the customer that the file submitted was of the wrong format, and further advising the customer what CAD file formats are acceptable.

The customer's CAD file 32 entirely defines the part 10. The next step in the process is performed by a geometry analyzer module 38, which assesses the geometry of the customer's part 10 using a set of acceptability criteria 40, 42, 44, 46. This geometry analyzer module 38 is used to determine whether the part or the mold for the part defined by the customer's CAD file 32 can be inexpensively manufactured in accordance with the present invention. Various acceptability criteria can be used, depending upon the software and manufacturing capabilities used in automated manufacturing of the part or mold.

For example, if the software and manufacturing capabilities are limited to manufacturing straight pull molds only, the first preferred single axis acceptability criterion 40 corresponds to whether the part can be molded in a straight pull mold. If desired, an individual may view the customer's CAD file 32, either through a printout drawing or on-screen, to visually inspect and determine whether the part can be manufactured in a straight pull mold.

Figure 3:
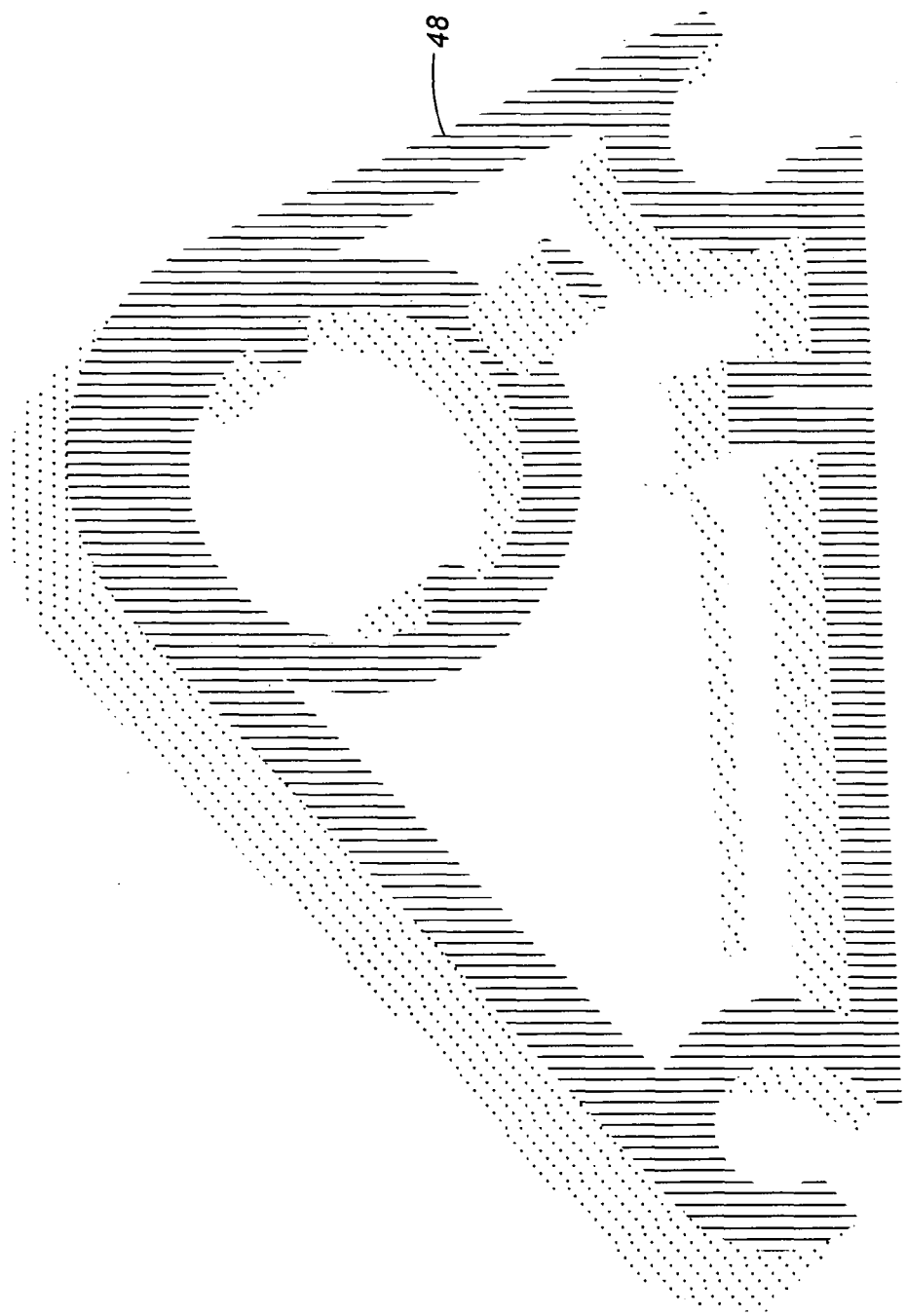
FIG. 3 is a representational view conceptually showing failure of straight pull in a y-axis direction.
Figure 4:
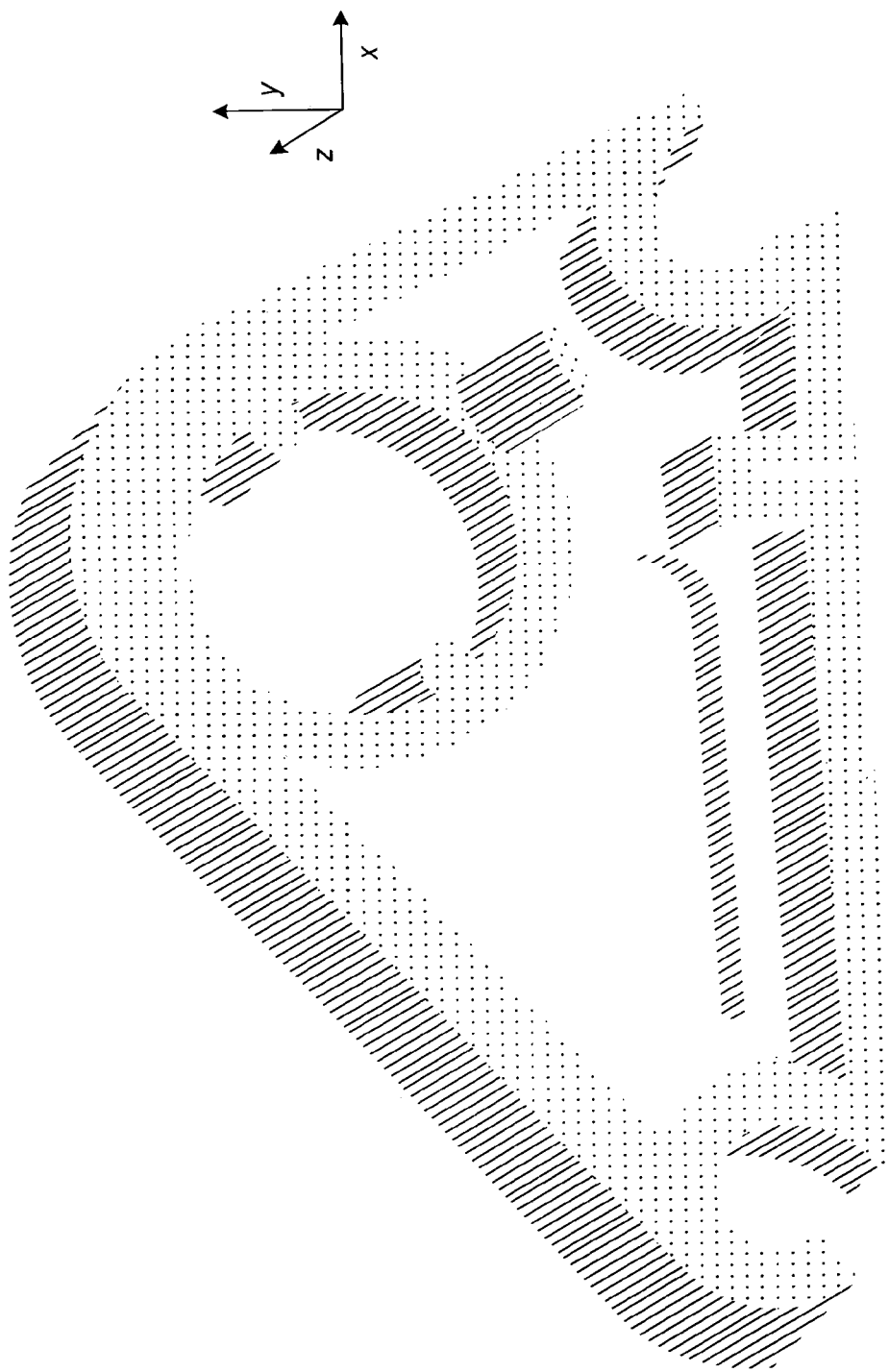
FIG. 4 is a representational view conceptually showing acceptance of straight pull in a z-axis direction.

However, in the preferred embodiment, the program automatically identifies whether the part can be manufactured in a straight pull mold. Automatic "straight pull" manufacturability identification 40 involves selecting an orientation of the part in the customer's CAD file 32. Customers typically draw parts oriented with an x-, y- or z-axis which coincides with the most likely straight pull direction. FIGS. 3 and 4 represent an example of this. First, the cam 10 is solid modeled in the y-direction as a plurality of parallel line segments extending in the y-direction as shown in FIG. 3. The geometry analyzer module 38 then considers each line in the solid modeling, to determine whether the line is continuous and intersects the part surface profile only at a single beginning and a single ending. As shown here, line 48 is a first line which fails this test, as it intersects the cam 10 three times: once through the part outline flange 12 and twice on the sides of the 60° corner hole 24. The y-direction orientation of this part 10 thus fails to permit straight pull mold manufacturability 40. The cam 10 is next solid modeled in the z-direction as a plurality of parallel line segments extending in the z-direction as shown in FIG. 4. The geometry analyzer module 38 again considers each line in the solid modeling, to determine whether the line is continuous and intersects the part surface profile only at a single beginning and a single ending. As shown here in FIG. 4, all the line segments meet this test 40. Because the cam 10 passed the test 40 in the z-direction, it is thus determined that the part 10 can be oriented such that the z-direction is the straight pull direction. Thus, the cam 10 can be formed with a straight pull mold with the straight pull direction coinciding with the z-direction as drawn.

If desired, the "straight pull" single axis manufacturability identification 40 can be terminated once it is determined that at least one orientation of the part 10 exists which can be manufactured with a straight pull mold. Preferably, additional tests continue to be automatically run by the geometry analyzer module 38 to confirm the best orientation of the part 10 which can be manufactured with a straight pull mold. For instance, a similar x-direction test is run, which this cam part 10 fails similar to the y-direction test. Similarly, additional orientational tests can be run, with the parallel lines in the solid modeling run at angles to the x-, y- and z-directions selected in the customer's CAD file 32. If the part passes "straight pull" single axis manufacturability 40 on two or more orientations, then an assessment is made of which orientation should be used for the mold. Computer programmers will recognize that, once the acceptability criteria are defined to include a single axis determination 40 of whether the part can be molded in a straight pull mold and the orientation necessary for molding in a straight pull mold, there are many equivalent programming methods to apply this acceptability criterion 40 to the customer's CAD file 32.

If the software and manufacturing capabilities are limited to direct machining rather than molding, then the first preferred single axis acceptability criterion 40 corresponds to whether the part can be machined in a three axis CNC mill with only two opposing orientations of the workpiece material block, with the CNC mill oriented in the z-direction removing material over the full x-y extent of the A-side and B-side of the part.

Figure 5:
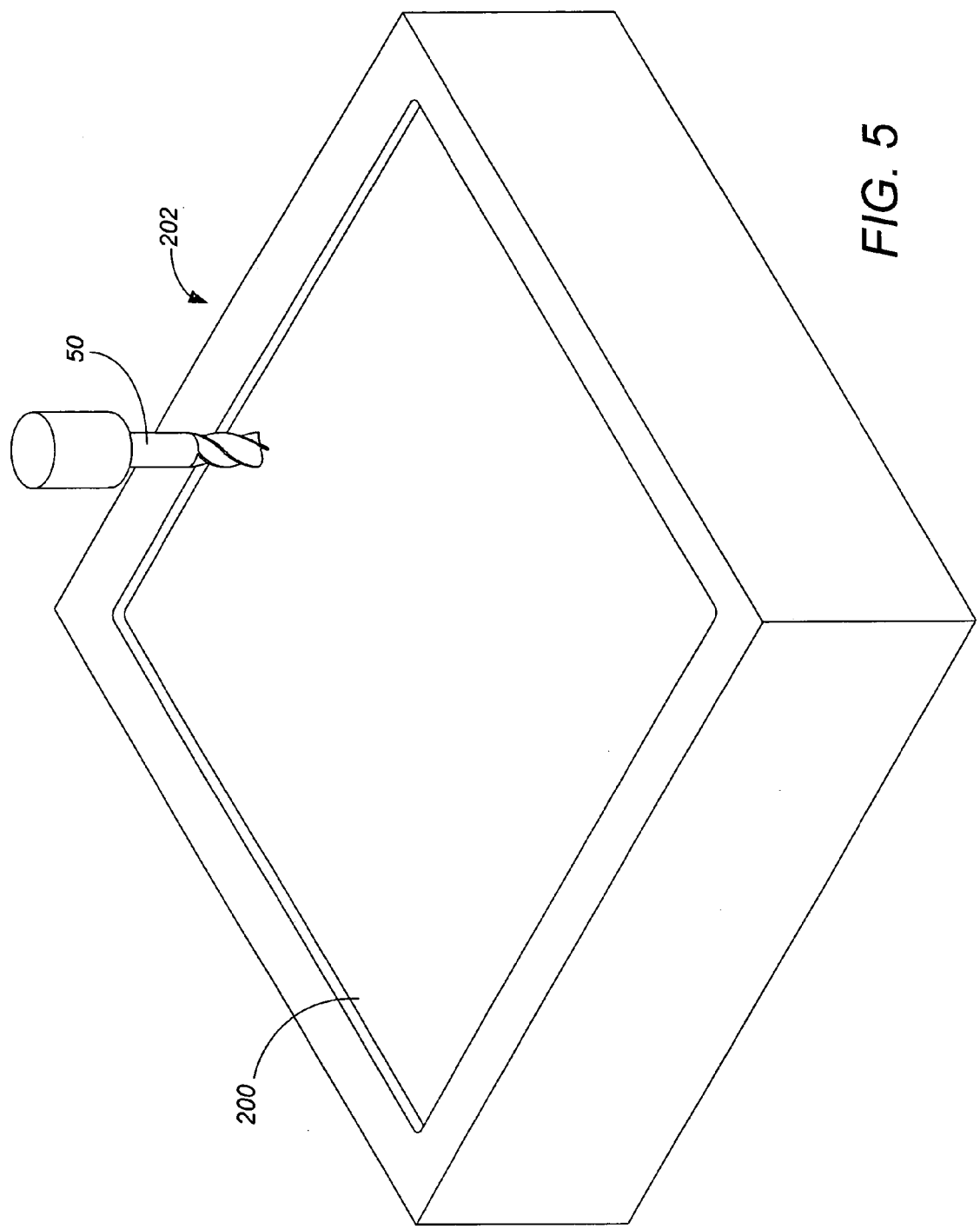
FIG. 5 is a perspective view of CNC machining a registration recess into a block of material.
Figure 6:
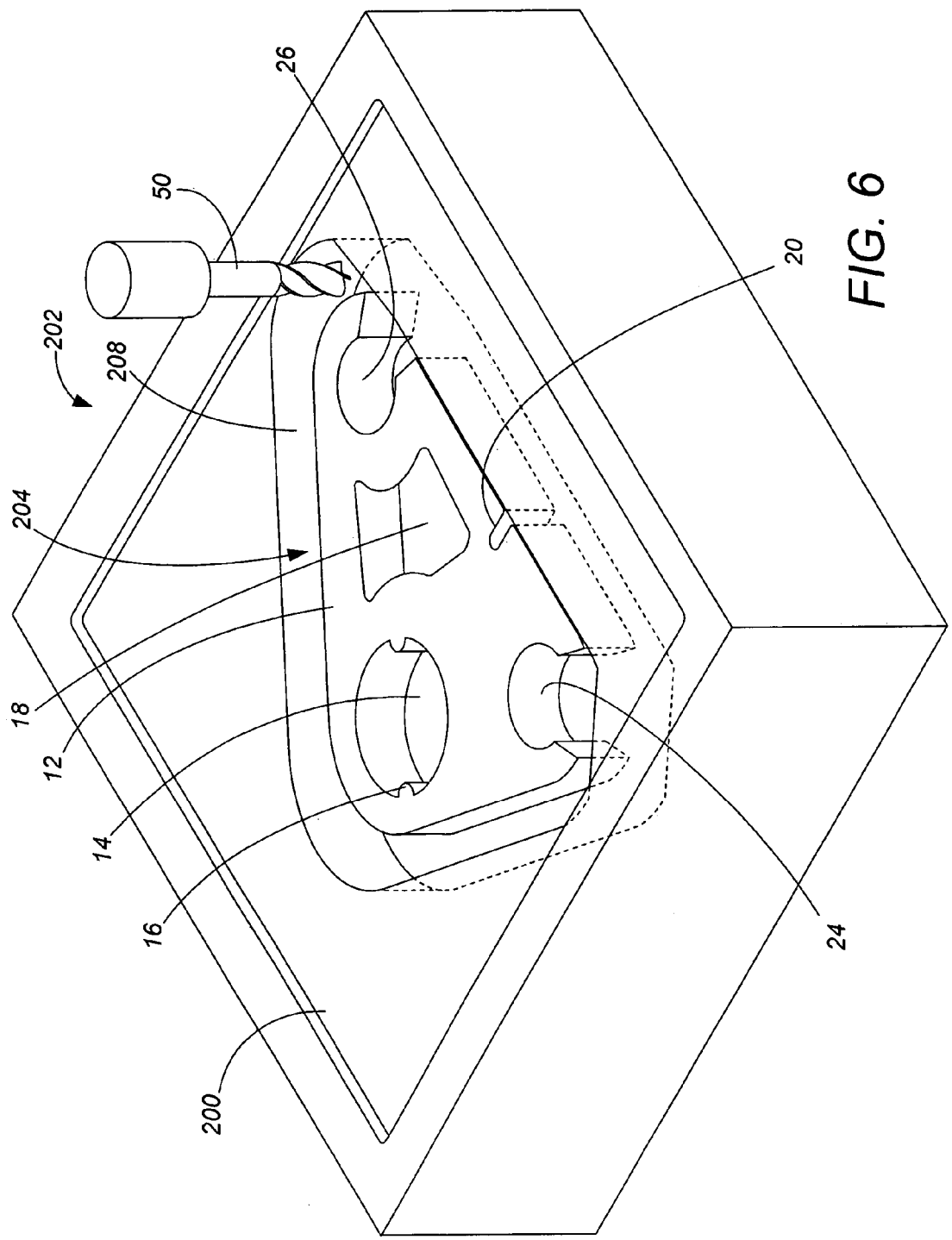
FIG. 6 is a perspective view of CNC machining further features of a first or "A" side of the part in the block of material.
Figure 7:
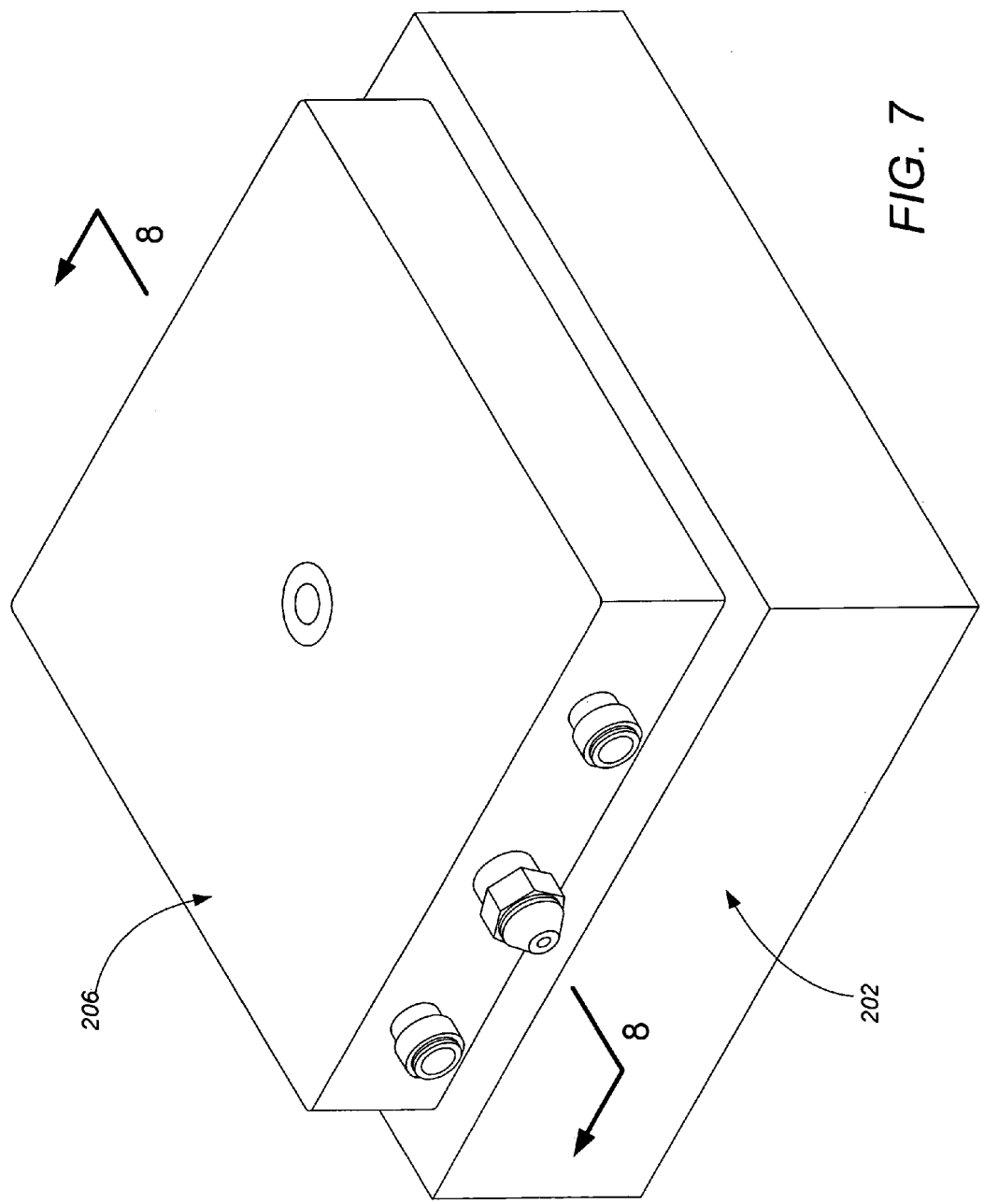
FIG. 7 is a perspective view of a potting/registration fixture in the registration recess.
Figure 8:
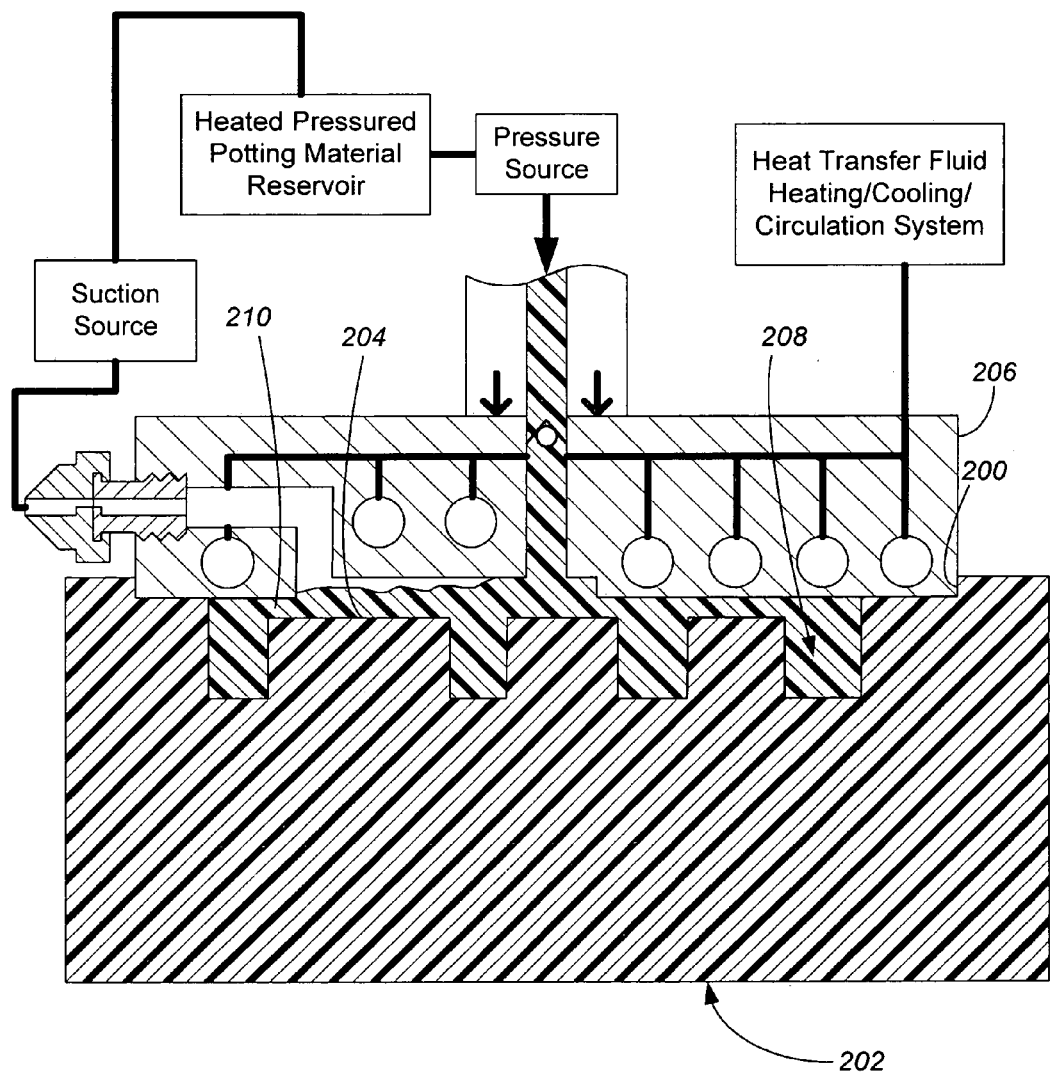
FIG. 8 is a cross-sectional view taken at lines 8-8 during potting using the potting/registration fixture.
Figure 9:
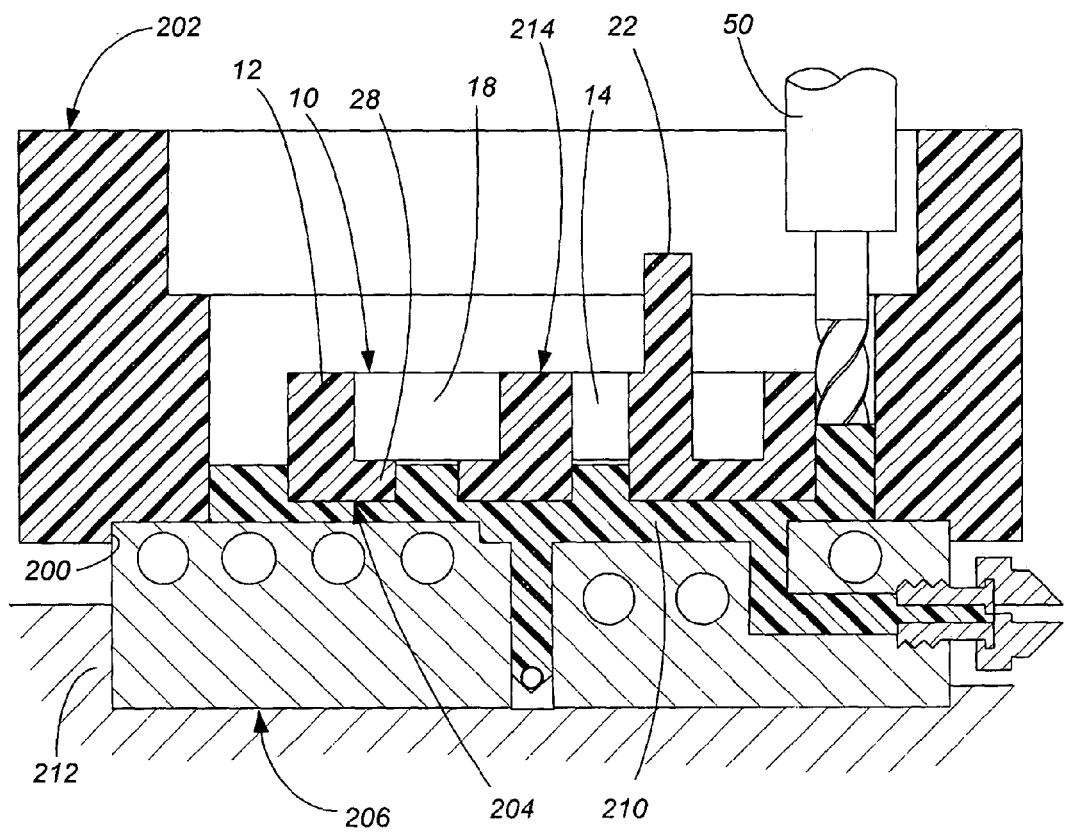
FIG. 9 is a cross-sectional view taken at the same (lines 8-8) cut location as FIG. 8 during CNC machining of a second or "B" side of the part in the block of material.

In particular, the invention can use the manufacturing methods shown in FIGS. 5-9, and further described in copending application Ser. No. 11/586,223, filed on even date herewith and entitled AUTOMATED TOTAL PROFILE MACHINING OF PARTS, incorporated by reference. In the preferred method, such total profile machining of the part 10 generally begins with an act of machining out a registration/potting recess 200 from a workpiece block 202 as shown in FIG. 5. A first side 204 of the part 10 is then CNC machined into the workpiece block 202 as depicted in FIG. 6. The single axis acceptability criterion 40 thus verifies that the first side 204 of the part 10 can be CNC machined in a 3 axis mill with the block 202 held in a single orientation. A registration/potting fixture 206 is placed into the registration/potting recess 200 as depicted in FIG. 7, and the CNC machined cavity 208 is packed with a fluid potting or support material 210 as depicted in FIG. 8. After the potting material 210 solidifies, the registration/potting fixture 206 is used in fixturing the workpiece block 202 into the 3 axis CNC mill 212, and the second side 214 of the part 10 is CNC machined as depicted in FIG. 9. The single axis acceptability criterion 40 thus verifies that the second side 214 of the part 10 can be CNC machined in a 3 axis mill 212 with the block 202 held in a single orientation, so the part 10 can be total profile machined in only two opposite-sided fixturing steps in the 3 axis CNC mill 212.

In the most preferred embodiment, the software and manufacturing capabilities permit both direct machining and molding. The single axis acceptability criterion 40 is then used to qualify the part 10 both for the preferred molding and the preferred machining techniques.

If the CAD file 32 for the part 10 fails the single axis manufacturability test 40 such as due to the presence of undercuts, the preferred system can follow either or both of two options. A first option provides the customer with a graphical image of the part 10 in an orientation that comes closest to passing the straight pull single axis manufacturability test 40, but further with faces that have undercut portions highlighted. A comment is provided to the customer that the design of the part 10 should be revised to get rid of the undercuts. If desired, these changes can be provided to the customer using the software presentation systems described in U.S. patent application Ser. No. 11/369,120 filed Mar. 6, 2006 and entitled MANIPULATABLE MODEL FOR COMMUNICATING MANUFACTURING ISSUES OF A CUSTOM PART and in U.S. patent application Ser. No. 11/368,590 filed Mar. 6, 2006 and entitled GRAPHICAL USER INTERFACE FOR THREE-DIMENSIONAL MANIPULATION OF A PART, both incorporated by reference.

A second option further assesses the CAD file 32 for the part to assess whether the part can be manufactured in a straight pull mold with side actions that exist only at the parting line, i.e., without "submerged" side actions, and further with side actions with an x-y slide direction. As workers skilled in the mold manufacturing art will recognize and as the "side action" name implies, side actions are portions of the mold which move to the side (i.e., typically in the x-y plane) during the molding process. An example is shown and further described below with reference to FIG. 10. Side action 124 is typically machined out of an additional piece of metal, in addition to the "A" and "B" mold blocks. The side action 124 rides on an angled slide (not shown) which pushes the side action 124 toward the cavity to complete the mold when the "A" and "B" sides of the mold 86 are pressed together in the injection mold press. When the "A" and "B" sides of the mold 86 are pulled apart in the injection mold press to eject the part, the angled slide causes the side action 124 to pull back from the primary cavity 84. Side actions 124 which can pull in the x-y plane at the parting line are simpler to manufacture than either side actions which are either out of the x-y plane or submerged side actions. The side action 124 must have a defined slide direction 128 in the x-y plane and at the parting line which will not cause interference with other portions of the mold 86. The preferred side actions 124 will permit an angle of the interface 130 of the side action 124 with the mold 86 which falls within about 5 to 45° from the slide direction 128. Too narrow of an interface angle causes excessive wear of the side action 124 during molding of parts, but might be acceptable if a very limited quantity of parts is required. Too great of an interface angle increases the precision with which the side action 124 must mate with the cavity to minimize witness marks between the side action 124 and the "A" and "B" sides of the mold 86.

If the part is to be total profiled machined rather than molded, then the second option further assesses the CAD file 32 for the part to determine whether the part can be machined in a 3-axis CNC mill using one or more x or y orientations and accordingly are orthogonal to a face of the preferred potting/registration fixture, regardless of whether such side actions are at the parting line or would be "submerged".

Thus, the preferred "straight pull" single axis manufacturability criterion 40 accepts parts which require side actions, providing any side action meets a set of criteria for determining the complexity of the side action, or parts which require side machining, providing such side machining meets a set of criteria for determining the complexity of the side machining.

If desired, the "straight pull" single axis manufacturability criterion 40 may assess not only whether a straight pull mold is possible at the selected orientation or 3-axis machining is possible at the selected orientations, but may further evaluate draft angle. Draft angle affects the ease of machining the part or the mold, as vertical edges are more difficult to machine. Draft angle also affects the ease of using the mold, as more vertical sides have a higher sticking force making ejection of the part 10 from the mold more difficult. Thus, more robust ejection pin systems may be needed for parts with high draft angles. For example, in a preferred straight pull manufacturability criterion 40, draft angles on all sides of at least 0.5° are required. The straight pull single axis manufacturability criterion 40 will thus automatically identify zero-drafted (vertical) surfaces and reject such parts as failing the straight pull single axis manufacturability criterion 40. If desired, parts which are rejected as not having a sufficient draft angle may be changed and presented to the customer in graphical format in accordance with the teachings of U.S. patent application Ser. No. 11/338,052 filed Jan. 24, 2006 and entitled COMMUNICATING MOLD/PART MANUFACTURABILITY ISSUES, incorporated by reference.

In the preferred embodiment, the present invention further reviews the part design using a second acceptability criterion 42, of whether the part or mold geometry can be formed through machining with a standard set of CNC machining tools. This second acceptability criterion 42 involves determining which tools are available, what are limitations in using the available tools, and defining areas (if any) of the part or mold which cannot be machined with the available tools. Because this second acceptability criterion 42 has significant overlap with generating the automated set of CNC machining instructions in the tool selection and tool path computation module 68, it is discussed in further detail below. In particular, however, the preferred standard CNC machining tools include a collection of standard-sized endmills, standard-sized reams and standard-sized drills. With this collection of standard CNC machining tools, limitations exist with respect to the radii of curvature of various edges and corners, and with respect to aspect ratio of deep grooves in the part or in the mold. In general, an edge of a molded part cannot have a tighter radius of curvature than the smallest endmills and drill bits. In general, any grooves in the mold, which correspond to any ribs in the part, must have an aspect ratio which permits at least one of the standard CNC machining tools to reach the depth of the groove. In general, any groove in a machined part cannot have a tighter radius of curvature than the smallest endmills and drill bits and must have an aspect ratio which permits at least one of the standard CNC machining tools to reach the depth of the groove.

Figure 11:
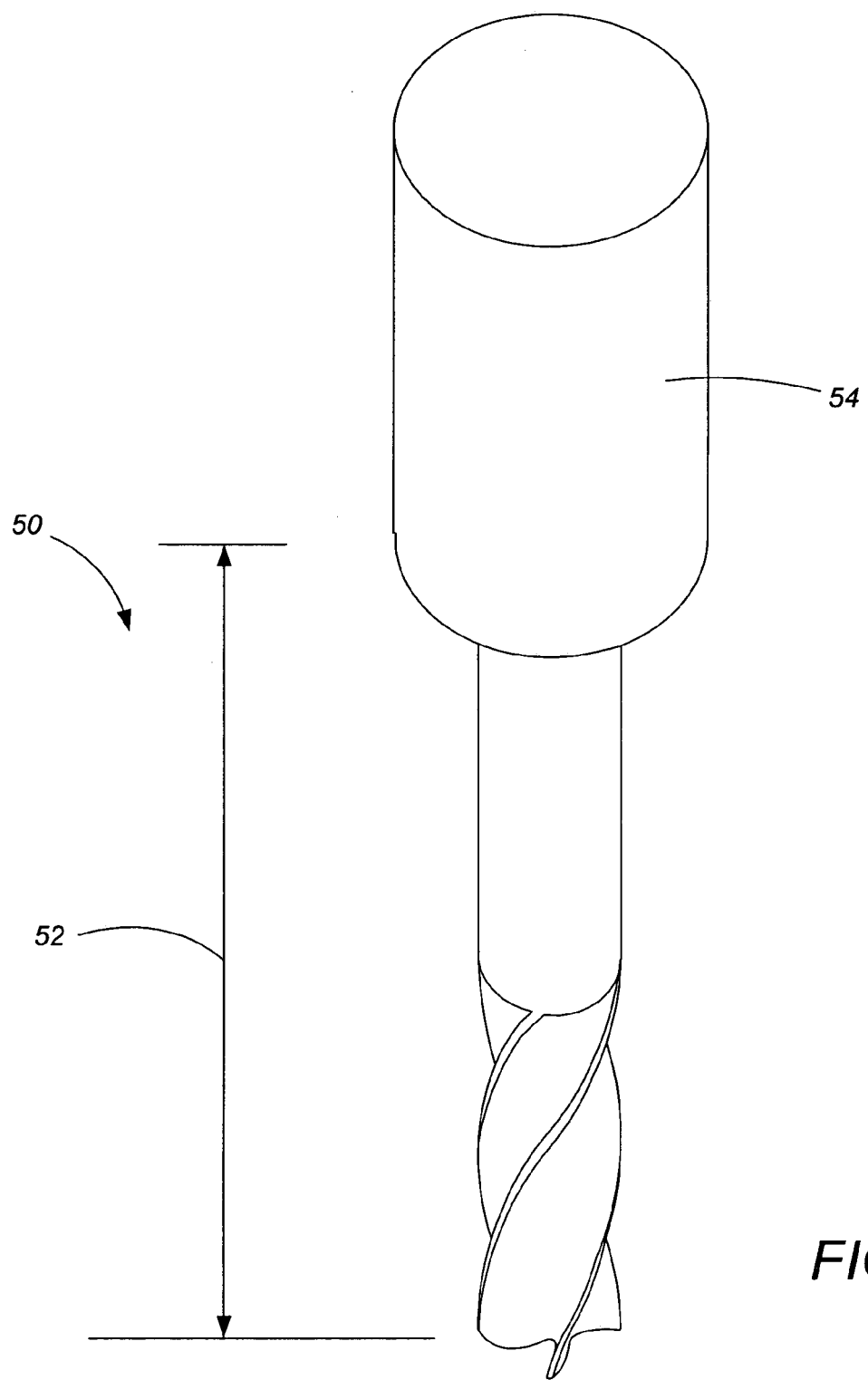
FIG. 11 is a perspective view of a standard endmill.

For example, FIG. 11 depicts the profile of a standard ¼ inch diameter endmill 50. This endmill 50 has a cutting depth 52 of slightly less than 2 inches limited by a collet 54. If a ¼ inch thick groove in the mold has a height of 2 inches or more, then the standard ¼ inch diameter endmill 50 cannot be used to form the groove portion of the cavity. The aspect ratios of standard endmills are based upon the strength of the tool steel (so the tool 50 won't easily break in use), and follow a similar aspect ratio curve. That is, all endmills which are less than ¼ inch in diameter are shorter than the standard ¼ inch diameter endmill 50. All endmills which are longer than 2 inches are wider than ¼ inch in diameter. Thus, no tool in the standard set can be used to make a groove ¼ inch thick with a height of 2 inches or more. As an approximate rule, grooves/ribs should be no deeper than ten times their minimum thickness. The geometry analyzer module 38 includes analysis 42 run against the customer's CAD file 32, to conceptually compare the part shape against collected geometric information of a plurality of standard tool geometries, such as standard endmills. For molding of the cam 10, all of the CAD file 32 passes except for the rib 22, which is too thin and long. For machining of the cam 10, all of the CAD file 32 passes except for the notch 20, which is too thin and long. Thus it will be understood that certain part may pass the standard set of CNC machining tool criterion 42 for direct machining and molding, for direct machining but not molding, for molding but not direct machining, or for neither direct machining nor molding.

The preferred CNC machining criterion 42 further considers aspect ratios of grooves relative to the parting line of the mold. Because endmills can be used downward in the bottom half (cavity) of the mold and upward in the top half (core) of the mold, aspect ratios of features which contain the parting line can be twice that of aspect ratios of features which do not contain the parting line. That is, groove depth is measured relative to the lowest adjacent extending surface on the half of the mold in which the groove is machined. In direct machining, because endmills can be used downward on the top half of the part and upward on the bottom half of the part, aspect ratios of features which contain the orientation separation line can be twice that of aspect ratios of features which do not contain the separation line. In the cam 10, for instance, the inside edge of the part outline flange 12 does not intersect the parting line, because the parting line extends along the inside edge of the partial web 28. The depth of the part outline flange 12 is therefore measured relative to the adjacent extending'surface, the partial web 28. The aspect ratio determined by this depth of the part outline flange 12 relative to the thickness of the part outline flange 12 must be within the aspect ratio of at least one tool in the standard set. In contrast, the outer edge of the part outline flange 12 has no adjacent extending surface and intersects the parting line. Because the parting line separates the outer edge of the part outline flange 12 into the two mold blocks, the depth of the outer edge of the part outline flange 12 relative to its thickness can be up to twice the aspect ratio of at least one tool in the standard set.

The CNC machining criterion 42 runs similar programming analysis to verify that each exterior corner of the molded part 10 or interior corner of the machined part 10 has a sufficient radius of curvature to permit machining by one of the standard CNC machining tools. For instance, the CNC machining criterion may limit the minimum radius of outside corners of the part to no less than ½ the minimum wall thickness. If the CAD file 32 fails either due to having too deep of grooves or having too tight of corners, the part fails the CNC machining criterion 42, and the customer must be informed. Computer programmers will recognize that, once the acceptability criteria 42 are defined to include a determination of whether groove depths and/or corner radii of the part permit standard CNC machining, there are many equivalent programming methods to apply this acceptability criterion to the customer's CAD file 32.

In the preferred embodiment, the geometry analyzer module 38 further reviews a third acceptability criterion 44, of whether the mold geometry can be formed in aluminum or in an aluminum-based alloy, or of whether the direct machined part can be machined of the selected workpiece material. That is, a design parameter imposed upon the preferred molding system is that the mold be manufacturable from standard aluminum-based mold block stock. Aluminum is selected for cost reasons, with a primary cost savings in that aluminum is more quickly machined than steel, and a secondary cost savings in that the aluminum blocks themselves are less expensive than steel. However, aluminum is not as strong as steel, and excessively thin structures of aluminum will not withstand the forces imparted during injection molding. Accordingly, the program looks at the mold to determine whether any portions of the mold are too thin. The cam 10 has one thin recess, the notch 20, which if sufficiently thin and deep fails this criterion. That is, as the cam 10 was designed by the customer, the mold for the cam 10 cannot be formed of aluminum and withstand the forces of injection molding. Conversely, if the part 10 is direct machined, the determination of whether the rib 22 can be machined depends upon the material selected for the part. Computer programmers will recognize that, once the acceptability criteria 44 are defined to include a determination of whether the mold can be formed of aluminum, or whether the part can be direct machined of the selected workpiece material, there are many equivalent programming methods to apply this acceptability criterion to the customer's CAD file 32.

One of the preferred inputs to the customer data input module 30 from the customer 34 is the type of material which is selected for the part 10. For instance, the customer data input module 30 may permit the customer to select molding from any of the following standard plastics: ABS (natural), ABS (white), ABS (black), ABS (gray—plateable), Acetyl/Delrin (natural), Acetyl/Delrin (black), Nylon (natural), Nylon (black), 13% glass filled Nylon (black), 33% glass filled Nylon (black), 33% glass filled Nylon (natural), 30% glass filled PET/Rynite (black), Polypropylene (natural), Polypropylene (black), Polycarbonate (clear), Polycarbonate (black), Ultem 1000 (black), Ultem 2200 (20% glass filled) (black), Ultem 2300 (30% glass filled) (black). Different plastics have different viscosity curves at molding temperatures, different solidification rates, and different shrinkage rates. In the preferred embodiment, the program further reviews a fourth acceptability criterion 46, of whether the mold geometry can be adequately injection molded with the plastic material selected by the customer. This acceptability criterion 46 involves an assessment of whether the mold contains areas that will not shrink uniformly for the selected plastic material, and whether gating can be readily machined into the mold, to result in an acceptable flow path for the plastic which will be met at an attainable mold temperature and pressure so the shot adequately and uniformly fills the cavity. The term "plastic" material, as used in this application, is broadly defined and is not intended to limit the type of material which can be used in the injection molding process to polymers; in certain configurations materials (ceramics, glasses, sintered or low-melting-temperature metals, etc.) which are not polymers may be the plastic material used in the invention.

If the part is to be direct total profile machined, a different set of materials is permissible. For instance, the customer data input module 30 may permit the customer to select direct machining from any of the following: Acetal (including Copolymer or Homopolymer—DELRIN, SUSTARIN, ULTRAFORM, ENSITAL, POMALUX, TURCITE, ACETRON, TECAFORM or ERTACETAL), Acrylic or Acrylic+PVC (KYDEX or PLEXIGLASS), ABS (ABSYLUX, ENSIDUR or TECARAN), Chlorinated PVC, Cyclic Olefin Copolymer (TOPAS), ETFE (TEFZEL), Fiberglass, HDPE (SANALITE or SEABOARD), Laminates (FR-4, FR-5, G-3, G-5, G-7, G-9, G-10, G-11 or CIP) Machinable Glass Ceramic (MACOR), Nylon (ENSILON, ERTALON, NYLOIL, NYLATRON, TECAMID or TECAST), Perfluoralkoxy (TEFLON), Phenolic (BAKELITE, MICARTA or NORNEX), PAI (TORLON or TECATOR), Polyarylate (ARDEL), PBI (CELAZOLE), PBT (HYDEX), PBT+PC (XENOY), PC (LEXAN, MAKROLON, ENSICAR, ZELUX, HYZOD, MACROLUX, TUFFAX or TECANAT), PCTFE (KEL-F), Polyester (ENSITEP or TECADUR), PEI (ULTEM, SUSTATED PEI, TEMPALUX or TECAPEI) PEEK (SUSTATEC, TECAPEEK or KETRON), PES (RADEL A or TECASON), Polyethylene (TECAFINE or CESTALINE), ECTFE (HALAR) PET (ERTALYTE, SUSTADUR or TECADURE), PETG (SPECTAR or VIVAK), Polyimide (SINTIMID, DURATRON, MELDIN, VESPEL or KAPTON), PMMA Acrylic (PLEXIGLASS, OPTIX), PMP (TPX), Polyparaphenyl (TECAMAX), PPO (NORYL or TECANYL), PPS (RYTON, TECHTRON, ENSIFIDE or TECATRON), PPSU (RADEL R), PP (including Copolymer or Homopolymer—ENSIPRO, PROPYLUX or TECAPRO), PS (REXOLITE), PSU (UDEL, TECASON or MINDEL), Polyurethane (ISOPLAST), PTFE (TEFLON, RULON, FLUORSINT or TECAFLON), PVC (TECAVINYL), PVDF (ENSIKIKEM, KYNAR or SYMALIT), UHMW Polyethylene (ENSICAR, TIVAR, LENNITE or TECAFINE), or other similar materials, in a range of various colors, fills and grades of these materials. Thus it will be understood that certain part may be of a material which permits direct machining and molding, which permits direct machining but not molding, or which permits molding but not direct machining.

Additional acceptability criteria could be included, such as related to the size of the part. For instance, the part may need to fit within a maximum projected area, as viewed through the straight-pull axis, of 50 sq. in. (400 sq. cm). Similarly, the part may need to be smaller than a maximum part volume, such as a maximum volume of 18 cu. in. (200 cc).

If the customer's CAD file 32 fails one or more acceptability criteria 40, 42, 44, 46, this failure is communicated to the customer. If desired, the failure to meet any acceptability criteria 40, 42, 44, 46, may be communicated through a telephone call. However, preferably the program automatically generates a computer message which is transmitted to the customer, such as an e-mail. The preferred acceptability failure message indicates the nature of the failure. In the most preferred embodiment, the program includes a proposed modification CAD file communication module 56.

The proposed modification CAD file communication module 56 involves several different steps. First, information is stored about each way in which the part 10 fails an acceptability criterion 40, 42, 44, 46. For instance, not only will information be stored that the cam 10 fails because the rib 22 is too thin and long and because the notch 20 is too deep and thin, but information is also stored about the closest rib and notch which would pass the acceptability criteria 42, 44. That is, by making the rib 22 slightly thicker, the rib 22 can be formed in the mold with standard CNC endmills. By making notch 20 slightly thicker, the aluminum mold will withstand the forces of injection molding. The proposed modification CAD communication module 56 then generates a modified CAD file 58, which distinguishes between the portions of the part geometry which pass all acceptability criteria 40, 42, 44, 46 and the portions of the part geometry which fail at least one acceptability criteria 40, 42, 44, 46.

Figure 12:
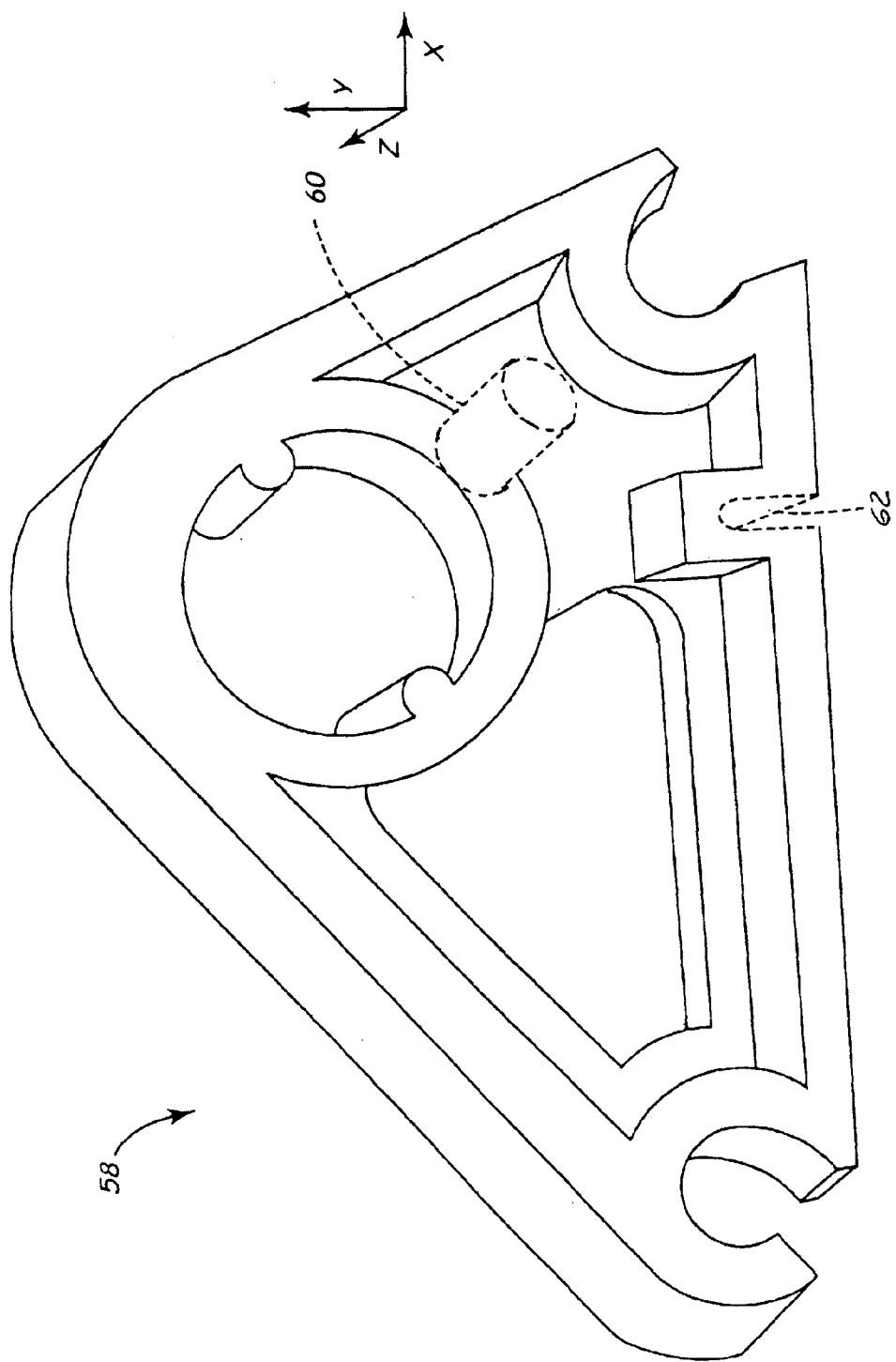
FIG. 12 is an exemplary product deviation file of the exemplary part of FIG. 1.

A drawing from the proposed modification CAD file 58 is shown as FIG. 12. The proposed modification CAD file 58 highlights the closest approximations 60, 62, relative to remaining unaltered portions of the cam design part surface profile 10 which pass all acceptability criteria 40, 42, 44, 46. Highlighting may be done through different line formats, different colors, etc. For instance, using one of predefined color coding schemes, colors are assigned to representative areas to show the identified association of the machinable points and to indicate the lack of appropriate tool. Alternatively or in addition to color coding, the highlighting may be done with indicia on the rendering of the part as taught in U.S. patent application Ser. No. 11/338,052 filed Jan. 24, 2006 and entitled COMMUNICATING MOLD/PART MANUFACTURABILITY ISSUES, incorporated by reference. The part geometry supplemented by the color or indicia data is preferably placed in a file 58 using one of the standard graphical formats suitable for rendering interactively manipulated three-dimensional views of the part 10. The file 58 together with the legend explaining the color coding or indicia scheme used can be sent or otherwise made available to the customer for interactive viewing, possibly with additional comments. For instance, the file 58 might identify one or more zero-drafted deep ribs. Comments included with the file 58 may request that the customer redesign the part to introduce at least 0.5 degree draft on deep ribs, or may say that the quote price can be lowered if the rib's walls are drafted. The proposed modification CAD communication module 56 then automatically transmits the proposed modification CAD file 58 to the customer, so the customer can view the changes required for inexpensive manufacture of the part and/or mold.

Skilled moldmakers and machinists will recognize that there are seldom mold and/or part designs that can't be done, only designs that can't be done without adding significant complexity. For instance, a mold for the cam 10 as originally designed by the customer could be formed, but it would be formed of steel rather than aluminum and the rib portion 22 of the mold would be burned by EDM. The present invention is configured based upon the capabilities of the moldmaking or machining shop. If the shop can handle CNC machined aluminum molds as well as EDM steel molds, then the program may assess acceptability criteria for both types of processes. If the shop can handle direct CNC machining of parts as well as CNC machining of molds, then the program may assess acceptability criteria for both direct machining and molding. If the customer's CAD file 32 fails at least one acceptability criteria for the less expensive method of manufacture, then a first proposed modification CAD file 58 may be generated and transmitted to the customer. If the customer's CAD file 32 passes all acceptability criteria for the more expensive method of mold manufacture, this information may be transmitted to the customer as well.

The present invention thus provides a computerized method for fast identification of the mold or part manufacturability issues. In ways that have never been before contemplated in the moldmaking art, and in particular without requiring a face-to-face meeting between a customer and an experienced moldmaker or machinist, manufacturability issues are automatically identified and communicated to the customer. The three-dimensional graphical representation 58 of manufacturability issues is very convenient and considerably simplifies communication of such issues to the customers. The geometry analyzer module 38 in tandem with the proposed modification CAD communication module 56 are valuable tools for the design engineer. These modules 38, 56 can be used during the development process to guide the design toward a part 10 that can be manufactured quickly and economically, whether or not it is quoted and manufactured in accordance with the rest of the preferred system.

The next part of the preferred system is the quoting module 64. If desired, quoting may be performed the prior art way, by having an experienced moldmaker or machinist review drawings of the customer's part 10 and meticulously consider what may be involved in making the mold or machining the part. More preferably however, the quoting module 64 automatically generates a quotation 66 for the mold and/or part, and transmits the automatically-generated quotation 66 to the customer 34.

To automatically generate a quotation 66, the program must assess one or more cost parameters which are indicative of the real costs which will be incurred to form the mold or machine the part. The most basic cost parameters preferably considered involve the machining actions which will be used.

That is, the preferred quotation 66 varies based upon computer analysis by the quoting module 64 of at least one indicator of mold or part manufacture time. Automatic determination of machining actions and/or other material removal steps in the tool selection and tool path computation module 68 is further detailed below. If machining actions are automatically determined, then the quoting module 64 automatically assesses the determined machining actions to arrive at a quotation 66.

As one example, a primary indicator of overall mold manufacture time is how long it takes to CNC machine and remove material corresponding to a positive image of the part in the mold halves. Similarly, a primary indicator of overall direct machining time is how long it takes to CNC machine and remove material corresponding to a negative total profile of the part in the workpiece block material. A primary indicator of how long it takes to CNC machine either the mold or the part is the number of steps in the series of CNC machining instructions. Thus, the automatic quotation 66 may be based in part or in full on the number of steps in the series of CNC machining instructions.

As a further, more accurate iteration, how long it takes to CNC machine the mold or total profile machine the part further depends upon which tools are used and what the material removal rate of each tool 50 is. Thus, the quoting module 64 stores information about a rate of material removal associated with each of the different material removal steps. The preferred quoting module 64 automatically identifies an estimated duration of material removal required for each discrete portion of the part surface profile. The automatic quotation 66 may be based in part or in full on a total of estimated durations of material removal.

If desired, the Customer Data Input module 30 may permit the customer to select a special surface finish, such as a polished finish, matte (similar to EDM), or special etched textures. If so, the automatic quotation may further vary based upon the difficulty in applying the selected special surface finish to the mold or to the part surface.

In general, the time required during material removal is only a portion of the time required for CNC machining. Additional time is required to change from one tool to another. For instance, standard CNC machines may include spots for 10 to 40 tools. Changing among these 10 to 40 tools takes additional time. Further, a portion of the cost of CNC machining is based upon the expense and wear rate of the tool 50. Some tools are more expensive than others, and some tools need to be replaced more frequently than others. Even more time and cost may be incurred if a special, custom or delicate tool is required for some material removal steps. As a separate, more accurate enhancement, the quoting module 64 may consider the number and type of tools used in the selected material removal steps.

A separate iteration which improves the accuracy of a molding quotation 66 involves having the quoting module 64 consider the parting line and corresponding shutoff surfaces of the mold. In general, simple molds which can be formed with an x-y planar parting line and shutoff surfaces are relatively inexpensive. A major portion of the expense of some molds may involve the time required to machine the parting line and corresponding shutoff surfaces which are not x-y planar. Separate from basing the quotation 66 on the number of CNC steps or on the estimated durations of material removal, the automatic quoting module 64 may consider the complexity in forming the parting line and corresponding shutoff surfaces. Alternatively, the quoting module 64 may ignore the complexity of building shut-off surfaces that are necessary in the full-blown mold design, particularly if the design of the shutoff surfaces is not automated.

Direct, total-profile machined parts do not have shutoff surfaces nor a parting line, but do have a machining orientation separation line. Non-planarity of the machining orientation separation line rarely affects the cost of part machining. More significant is the preferred machining operation is the machining of the registration recess, whether a stepped profile is required for the encircling cavity on the A-side of the part, the volume of support or potting material used, and the time for solidification of the support or potting material. If desired, the quoting module 64 may evaluate these costs for total-profile machined parts.

If the determined parting line is complex, it may be beneficial to inform the customer of the complexity in the parting line, either as part of the manufacturability criterion 40 or as part of the quoting module 64. Thus the customer may be allowed to have input in selection of a more simplified parting line, or the system may specifically suggest to the customer that the parting line or particular features in the part 10 which contribute to parting line complexity be moved.

Yet another separate indicator of mold or part manufacture time depends on the size of the part 10. Larger molds often take more time. Larger molds certainly require a greater expense in the cost of the raw mold blocks. Similarly, larger parts often take more time to total profile machine and require a greater expense in the cost of the raw workpiece blocks. The preferred quoting module 64 further accounts for the mold block area required for the molded part 10 or the cost of the workpiece block for total profile machining.

A further separate indicator of manufacture time involves ribbing and tightly radiused corners, as discussed previously with regard to acceptability criteria 40, 42, 44, 46 in the geometry analyzer module 38. Deep grooves in the mold or part and sharper corners take more time to machine. The preferred quoting module 64 further automatically assesses and accounts for the amount, depth and steepness of ribbing required for the part 10 or mold.

A further separate indicator of mold or part manufacture time involves evaluation of draft angle, as discussed previously with regard to acceptability criteria 40 in the geometry analyzer module 38. Evaluation of draft angle can be enhanced by including the minimal draft angle into the mathematical expression for the price quotation. Steeper draft angles typically take more time and are more costly to machine. Further, molded parts with steeper draft angles are more difficult to eject from the mold. The preferred quoting module 64 further automatically assesses and accounts for the steepness of the draft angles required for the part 10, either as an indicator of mold manufacture time and as a potential difficulty in use of the mold during injection runs, or as an indicator of direct CNC machining time. With the preferred mold manufacturability acceptability criteria 40 requiring a draft angle of at least 0.5°, the preferred quoting module 64 includes additional costs (which vary based upon the draft angle) for draft angles in the range of 0.5 to 2.0°. If all sides are provided with draft angles of at least 2.0°, then no additional cost allowance due to a steep draft angle is included by the preferred quoting module 64.

A further separate indicator of mold or part manufacturing difficulty and time depends upon whether and which features cannot be standardly CNC machined, but rather require EDM. The existence of any required EDM material removal will increase the costs. Each feature which requires EDM will increase cost, and more so if the EDM feature is deep enough to require, because of electrode wear, multiple EDM electrodes. The preferred quoting module 64 identifies any different discrete portions of the part surface profile which are associated with different electrodes for EDM, and the automatically generated quotation 66 varies based upon the estimated number of electrodes required.

A further separate indicator of mold manufacturing difficulty and time depends upon the existence and the complexity of any side actions. Side actions increase both the cost of manufacturing the mold and the cost of running the parts due to the potential for increase wear due to the side action movement. The preferred quoting module 64 identifies any required side actions, and the automatically generated quotation 66 provides a price adjusted for the side actions.

A further separate indicator of total profile machining difficulty and time depends upon the existence and the complexity of any side orientations of the part for machining with the 3 axis CNC mill. Machining orientations (other than the z-direction) which are parallel to a side wall of the registration/potting recess add a first expense, and machining orientations which are at an angle to all side walls of the registration/potting recess add a greater expense. The preferred quoting module 64 identifies any required additional machining orientations, and the automatically generated quotation 66 provides a price adjusted for the additional machining orientations.

In addition to parameters which influence mold manufacturing difficulty and time, some parameters influence molding quality. Experienced moldmakers will realize that some parts are inherently more easily molded than others. Shrinkage, warpage or incomplete filling of the mold with the shot can result either in reduced yield or in unsatisfied customers. The preferred quoting module 64 assesses predicted quality of the part, and increases pricing for molded parts which are likely to have low yields or poor quality. The primary way to assess predicted quality of the part is to analyze the flow characteristics and predict how the shot will fill the mold 86 and solidify. The preferred quoting module 64 includes a flow assessment, which involves a finite element analysis of the resin material as it fills the mold cavity 84. Major flow paths of the molten resin (both through gates and later within the body of the mold) are identified and analyzed relative to the temperature, pressure, viscosity, heat transfer and shear rates of the material. The ease with which a mold will be able to achieve a consistent, uniform fill to result in a high quality part 10 is assessed and graded as a "quality of part" parameter. In general, the "quality of part" parameter, as used in this application, is directed at any assessment of how easily the part will be molded by analyzing the shot. The term "shot", as used in this application, refers to the injected molten plastic and any of its characteristics prior to its final solidified dimensions. Molded parts which are easier to achieve high quality and high yield are quoted at prices lower than parts which are difficult to fill or likely to have excessive shrinkage or warpage problems.

Many customers have no injection mold experience or equipment, or otherwise are not interested in taking actual possession of the mold. While the cost to manufacture the mold may be the primary cost of the part, customers often want parts, not molds. Accordingly, the preferred quoting module 64 quotes piece prices. For total profile machined parts, each part is separately machined, so costs reductions for quantity are virtually non-existent. Often one to about five copies of a part can be total profile machined at a lower cost, but higher volumes of parts can be more efficiently molded. Different piece price quotations 66 may be given, for instance, for 1, 10, 100, 1000, or 10000 parts. In addition to the cost of the mold of the machining and potting time and expense for the part, the primary cost considerations for piece price quotations 66 depend upon what type of plastics material is used, and how much of it. The preferred quoting module 64 automatically provides piece price quotations, which involve the cost of the mold or machining the part and further vary based upon the volume of the part and the plastic material selected by the customer for direct machining or injection molding.

The quoting module 64 communicates the quotation 66 to the customer, preferably through the internet 36 such as through the website (if real-time quotation is attained) or through a responsive e-mail to the customer's computer 34. The customer may then accept the quotation 66 through the same medium. It is noted that the quotation provided by the quoting module 64 need not represent a legal offer to enter into a contract for manufacture of the mold 86 or parts 10. In the moldmaking and machining fields as well as in other industries, quotations are often given which are subject to final review by the company making the quotation before entering into a binding contract with an accepting customer.

Figure 13:
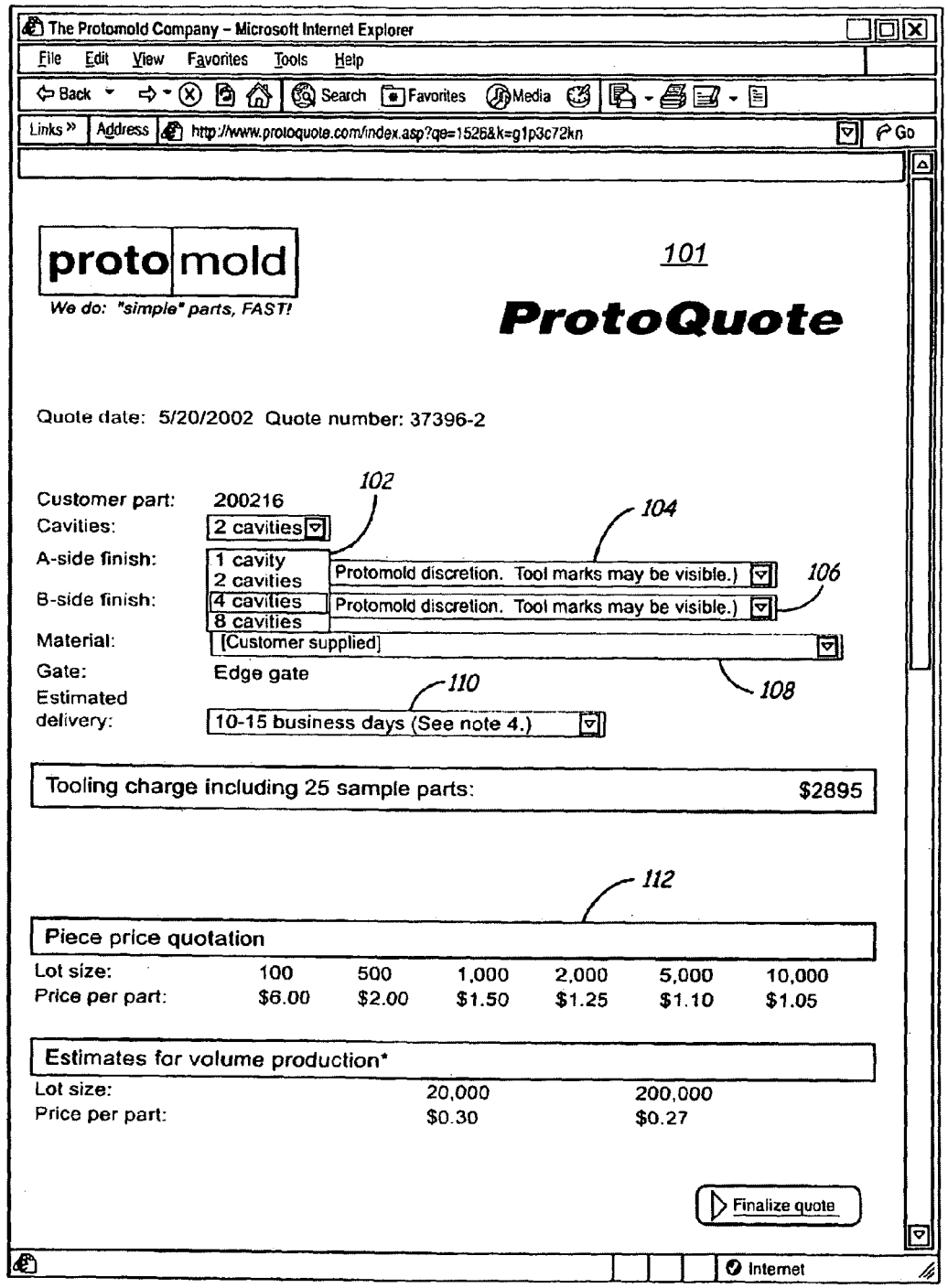
FIG. 13 is a computer screen shot of a preferred customer interface for the quotation system, showing customer selection of one parameter.

FIG. 13 depicts a screen shot 101 of a preferred customer interface for quoting module 64. The preferred quoting module 64 processes two different types of information to arrive at a quotation. First, the surface profile of the part 10 (which could have any of a virtually infinite number of shapes) is assessed, to consider certain cost-affecting parameters determined by the part surface profile. The second type of information is quite different from the infinite variability of the shape information, and involves providing the customer with at least one menu of customer-selectable values for a cost-affecting parameter unassociated with part surface profile.

For instance, a first preferred cost-affecting parameter unassociated with part surface profile is selected from a menu 102 of differing number of possible cavities. In order to provide the customer with a menu 102 of possible cavity numbers, the size and layout of the mold cavity 84 must first be assessed relative to the size of mold blocks available. For instance, a size comparison and mold layout analysis for one part 10 may result in a possibility of up to eight identical cavities being formed within a single mold block. The customer is then provided with a drop-down menu 102 of the number of possible cavities, for the customer to select between menu values of "1 cavity", "2 cavities", "4 cavities", and "8 cavities".

For a different part (not shown), the size comparison and mold layout analysis may result in a possibility over only four identical cavities being formed within a single mold block, in which case the drop-down menu 102 of the number of possible cavities for that part would only provide selectable values of "1 cavity", "2 cavities" and "4 cavities".

Total profile machined parts have a similar size comparison relative to the size of the workpiece block of material. If the size comparison and part layout analysis results in a possibility of multiple parts being simultaneously machined within a single workpiece block of material, the drop-down menu may similarly reflect the number of possible cavities or the number of possible parts machined in a single workpiece block.

The number of cavities or parts per block selected by the customer is then evaluated in the quoting module 64 as a cost parameter both for mold cost and for piece price cost, with mold cost increasing due to the additional time and cost required to machine more cavities or parts, but with piece price cost decreasing because multiple parts can be run with each shot or multiple parts can be machined from a single workpiece block. The preferred quoting module computes a quotation on the basis of a mathematical expression which describes several components of the price—such as the cost of mold block or workpiece block, milling time, polishing time, setup-time in the press or potting fixture, potting solidification time, etc. Some of these components may be independent of the number of cavities (e.g., setup time), some are directly proportional to the number of cavities (such as polishing time), some exhibit more complex dependence (for example, the cost of mold block for small parts does not depend on the number of cavities provided that several cavities fit in the same block—but increases if bigger mold block is needed). The quoting module 64 re-computes the quotation each time when the customer changes the available preferences.

A second preferred cost-affecting parameter unassociated with part surface profile which is menu selectable is surface finishes. The customer is provided with a drop-down menu 104 of offered surface finishes. For example, the customer may be provided with a drop-down menu 104 which allows the customer to select between values of "T-0 (finish to Protomold discretion. Tool marks may be visible)", "SPI-C1 (600 Stone)", "SPI-B1 (400 Paper)", "T-1 (Medium bead blast finish—similar to a medium EDM finish)", "T-2 (Coarse bead blast finish—similar to a coarse EDM finish)" and "SPI-A2 (High Polish)". In the preferred quoting module 64, the customer may select any of these different menu-provided surface finishes from a different drop-down menu 104, 106 for each side of the mold or for each side of the part 10.

In an alternative embodiment (not shown), the customer may be permitted to select different surface finishes between different faces even on the same side of the mold or part. To avoid naming confusion over the different faces, the alternative quoting module provides a graphical representation of each side of the part with different faces marked with indicia, such as shaded in different colors. The quoting module then provides a drop-down menu for each colored shading on the graphical representation (i.e., "surface finish for blue face" menu, "surface finish for red face" menu, etc.) so the customer can select the surface finish applied to each colored face of the depicted cavity 84.

Once the customer selects the drop-down menu value for the surface finish, the quoting module 64 assesses the cost of applying the selected surface finish for the cavity 84 or part 10, computed based upon the time, materials and tools required to apply the selected surface finish, preferably also as a function of the surface area for the applied finish.

A third preferred cost-affecting parameter unassociated with part surface profile which is menu selectable is material of the part. The customer is provided with a drop-down menu 108 of offered materials. The material or resin used for the part 10 is an integral consideration in the design process, affecting many material properties of the part 10 such as strength, flexibility, hardness, corrosion resistance, flammability, etc. Further, cost of each material or resin is subject to change due to market conditions. Accordingly, the preferred material menu 108 provides numerous alternatives. For example, the customer may be provided with a drop-down menu 108 which allows the customer to select between the following seventy moldable material values: "Customer supplied", "ABS, Natural (LUSTRAN 433-1050)", "ABS, Black (CYCOLAC T-4500)", "ABS, Black (LUSTRAN 433-4000)", "ABS, White (LUSTRAN 248-2005)", "ABS, Black (POLYLAC PA-765)", "ABS Platable, Light Grey (LUSTRAN PG298)", "ABS Platable, Gray (CYCOLAC MG37EP)", "ABS/PC, Black (BAYBLEND FR 110-1510)", "ABS, White (LUSTRAN 248-2005)", "ABS/PC, Light Gray (BAYBLEND T85 2095)", "ABS/PC, Black (CYCOLOY C2950-701)", "ABS/PC, Natural (BAYBLEND T 45-1000)", "ABS/PC, Black (BAYBLEND T 85-1510)", "ABS/PC, Black (BAYBLEND T85 2D95)", "Acetal Copolymer, Black (CELCON M90)", "Acetal Homopolymer, Black (DELRIN 500 P BK602)", "Acetal Homopolymer, Natural (DELRIN 500P NC010)", "Acetal Homopolymer, 20% GF, Black (DELRIN 577-BK000)", "Acetal Homopolymer, Black (DELRIN 500 CL BK601)", "HDPE, Natural (HiD 9006)", "LDPE, Natural (DOW LDPE 722)", "Nylon 46, Natural (STANYL TW341)", "Nylon 6, Natural (ZYTEL 7331F NC010)", "Nylon 6, Black (ZYTEL 7331F dyed)", "Nylon 6, Black (RTP 200A FR)", "Nylon 66, Black (ZYTEL 101L BKB009)", "Nylon 66, 13% GF, Black (ZYTEL 70G13 HSIL)", "Nylon 66, 14% GF, Black (ZYTEL 8018 HS)", "Nylon 66, 43% GF, Black (ZYTEL 74G43W BK196)", "Nylon 66 33% GF, Natural (ZYTEL 70G33HSIL)", "Nylon 66, 33% GF, Black (ZYTEL 70G33 HSIL BK031)", "Nylon 66, Natural (ZYTEL 103 HSIL)", "Nylon 66, Natural (RTP 202 FR)", "PBT 30% GF, Black (VALOX 420 SEO)", "PBT 15% GF, Black (CRASTIN SK 652 FR)", "PBT, Black (VALOX 357-1066)", "PC, Opaque/White (MAKROLON 2558-3336)", "PC, Black (LEXAN 940)", "PC, Clear (MAKROLON 2405-1112)", "PC, Clear (MAKROLON 2458-1112)", "PC, Black (MAKROLON 2405-1510)", "PC, 10% Glass, Black (MAKROLON 9415-1510)", "PC 20% GF, Natural (MAKROLON 8325-1000)", "PC 20% Glass, Black (MAKROLON 8325-1510)", "PC, clear (MAKROLON 6455-1045)", "PC, Infrared (LEXAN 121-S80362)", "PEI, Black (ULTEM 1000-7101)", "PEI, 20% GF, Black (ULTEM 2200-7301)", "PEI 30% GF, Black (ULTEM 2300-7301)", "PEI, 40% GF, Black (ULTEM 2400-7301)", "PET 30% Glass, Black (RYNITE 530-BK503)", "PET 45% Glass Mineral Flame Retardant, Black (RYNITE FR 945 BK507)", "PET 35% Glass Mica Low Warp, Black (RYNITE 935 BK505)", "PETG, Clear (EASTAR 6763)", "PMMA Clear (PLEXIGLAS V052-100)", "PP 20% Talc Filled, Natural (MAXXAM NR 218.G001-1000)", "PP, Black (MAXXAM FR 301)", "PP Copolymer, Natural (PROFAX 7531)", "PP Copolymer, Natural (PROFAX SR 857M)", "PP Homopolymer, Natural (PROFAX 6323)", "PP Homopolymer, Natural (PROFAX 6523)", "PS (GPPS), Clear (STYRON 666 Dwl)", "PS (HIPS), Black (RC 3502B)", "PS (HIPS), Natural (STYRON 498)", "PUR, Natural (ISOPLAST 202EZ)", "TPE, Natural (SANTOPRENE 211-45)", "TPE, Black (SANTOPRENE 101-73)", "TPU—Polyester, Black (TEXIN 285-1500)" and "TPU—Polyether, Natural (TEXIN 985-1000)". The customer may be further be permitted to select from the following machinable only values for workpiece block material: Acrylic+PVC (KYDEX or PLEXIGLASS), Chlorinated PVC, Cyclic Olefin Copolymer (TOPAS), ETFE (TEFZEL), Fiberglass, Laminates (FR-4, FR-5, G-3, G-5, G-7, G-9, G-10, G-11 or CIP) Machinable Glass Ceramic (MACOR), Perfluoralkoxy (TEFLON), Phenolic (BAKELITE, MICARTA or NORNEX), PAI (TORLON or TECATOR), Polyarylate (ARDEL), PBI (CELAZOLE), PBT+PC (XENOY), PCTFE (KEL-F), Polyester (ENSITEP or TECADUR), PEEK (SUSTATEC, TECAPEEK or KETRON), PES (RADEL A or TECASON), Polyethylene (TECAFINE or CESTALINE), ECTFE (HALAR), Polyimide (SINTIMID, DURATRON, MELDIN, VESPEL or KAPTON), PMP (TPX), Polyparaphenyl (TECAMAX), PPO (NORYL or TECANYL), PPS (RYTON, TECHTRON, ENSIFIDE or TECATRON), PPSU (RADEL R), PSU (UDEL, TECASON or MINDEL), PTFE (TEFLON, RULON, FLUORSINT or TECAFLON), PVC (TECAVINYL), PVDF (ENSIKIKEM, KYNAR or SYMALIT), UHMW Polyethylene (ENSICAR, TIVAR, LENNITE or TECAFINE), or other similar materials, in a range of various colors, fills and grades of these materials.

Once the customer selects the drop-down menu value for the material, the quoting module 64 assesses the cost of using the selected material. The primary input into the quoting module 64 based upon the selected material for molding is the current raw material cost multiplied by the computed volume of the part plus sprues and runners. The primary input into the quoting module 64 based upon the selected material for total profile machining is the current raw material cost multiplied by the volume of the workpiece block. However, other costs considerations of the selected material may also be taken into account, such as ease of working with the material, wear on the mold 86 caused by the material, shrink factor of the material, recycleability and/or waste cost for the material, etc. If the customer selects "customer supplied", then the quotation module 64 minimizes the cost of the raw material itself, but maximizes the cost of working with the material to account for potential difficulties.

A fourth preferred cost-affecting parameter unassociated with part surface profile which is menu selectable is the estimated delivery date. For instance, the customer may be provided with a menu 110 permitting selection of a delivery date of "within 5 business days" or "10-15 business days". Alternatively, additional or more specific levels of delivery date pricing may be provided. The preferred quotation module 64 thus includes a premium charged for rushed processing.

A fifth preferred cost-affecting parameter unassociated with part surface profile which is menu selectable is the number of parts or lot size for piece price quotation. For instance, the customer may be provided with a menu permitting selection of a piece price quotation in lots sizes of "100", "500", "1,000", "2,000", "5,000", "10,000", "20,000", "100,000" or "200,000" parts. This piece price quotation may then be provided to the customer separately from the tooling charge. Alternatively, the preferred quotation module 64 quotes prices 112 for all these different lot sizes, so the customer can readily see how the lot size affects the piece price.

In the preferred system, the quoting module 64 operates in conjunction with the geometry analyzer module 38 to provide graphical feedback to the customer. Preferably, this feedback occurs in real time to allow the customer to redesign physical features of the part 10 (i.e., change the underlying CAD file 32 for the part 10) while obtaining real-time quotation information of how the redesign affects the quotation.

The present invention, though able to produce straight-pull, two-piece molds at a minimal cost, can also support side actions in the mold. Side action molds allow molding parts with undercut faces—faces that need machining from a different direction. Permitting side action molds will thus increase the percentage of parts that are eligible for the automated process.

The quoting module 64 is another important tool which can be used by design engineers separately from other facets of the preferred system, such as to compare different design alternatives. Since it is fast and easy, instant online quoting is a powerful tool for budgeting and comparing design alternatives during the development process. Design engineers may use online quoting several times in the design of a single part and online quoting will become a very important part of their design process.

The present invention further provides several features to further utilize the value generated by the fact that design engineers may use a speedily delivered quotation to modify the part design. One of these features is a "budget-driven" or reverse quotation. In most design processes, the designer decides what the part 10 needs to look like, and then goes out to seek the lowest price for the part 10. Often, however, the design is driven as much or more by the budget for the item in question rather than the functional needs of the part 10. That is, the designer is put in the position of having to find a part design which will fulfill a basic function for X dollars. Overrunning the budget may not be an option, regardless of the benefits obtained by a slightly more expensive part, or costs may be so sensitive that the incremental cost for an improvement in design is not worth the added benefit. In a budget-driven quotation, the permissible cost is one of the basic inputs, and the object of the quotation is to determine how the resultant part design will differ from the original design while still staying within the budgeted cost.

Figure 14:
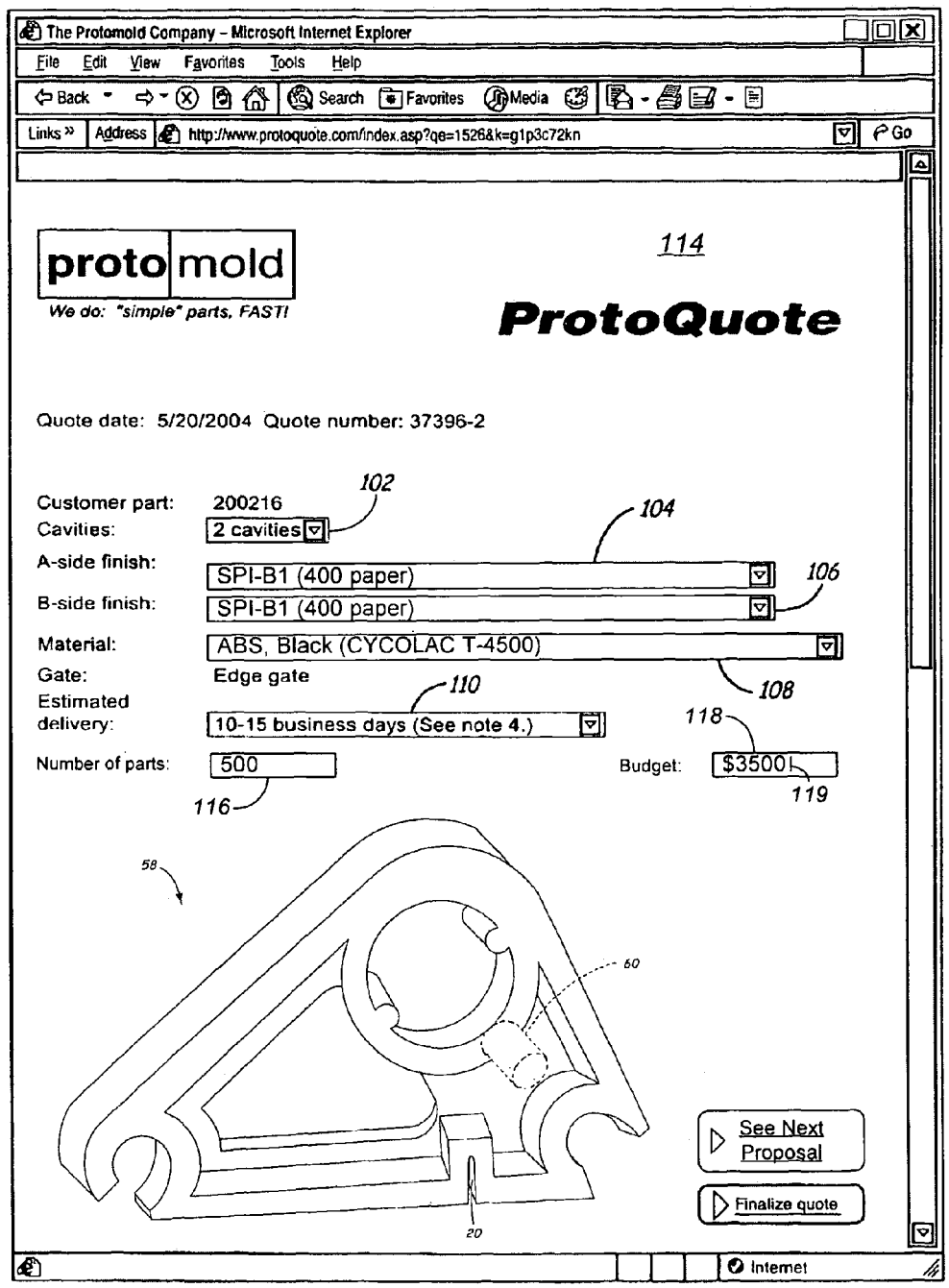
FIG. 14 is a computer screen shot of another preferred customer interface for the quotation system, showing customer input for a budget driven parameter.

An example of a budget driven quotation 114 is shown with regard to FIG. 14. The customer has initially selected to obtain a quantity 116 of 500 parts of customer part number 200216, run with black ABS in a double cavity mold, with SPI-B1 (400 Paper) finishes on both sides of the mold and delivered within 10-15 business days. However, the customer has also selected the budget driven quotation option, limiting the total budget 118 for the project to $3500.00. In the budget driven quotation process (similar to a reverse auction model for offering travel deals or insurance on the internet), this price 118 cannot be exceeded, and the goal of the budget driven quotation 114 is to propose the least intrusive modifications to the requested part 10 without overrunning the budget 118.

If desired, a single parameter might be selected as the sliding variable. For example, if lot size 116 is the sole variable which the system is permitted to change to meet the budget 118, then, when the customer hits "Enter" after completing the last piece of information (typically the budget value 118, shown in FIG. 14 with the cursor 119 positioned after just completing entry of the 3500 value, is that last piece of information entered), the quotation 114 is limited to 83 parts. The customer is shown on screen by the budget driven quotation 114 that the $3500 budget can be met. However, when the customer enters the budget data, the quantity 116 is changed and highlighted (changing and highlighting not shown), so the customer can readily see that the budget constraints resulted in a reduction of quantity of parts.

While reducing the quantity of parts is a simple example of a budget-driven quotation 114, often the budget 118 must be met without a reduction in the quantity 116 of parts 10. As another example, the budget driven quotation system 114 may only allow revision to the part geometry, not to any of the customer selected menu values. In this case, the budget driven quotation system 114 shows that one revision to the part geometry which would allow the quotation to meet budget is to increase the thickness of the rib 22 to 180% of the original thickness, to the modified rendering 60. The rendering 58 of the modification 60 is in some respects quite similar to the rendering proposed modification CAD file 58 used to qualify a part 10 for applicability with the automated process, but is conceptually different. That is, the geometry analyzer module 38 conceptually delivers a "Go/No Go" type of answer to the customer. In contrast, presuming the budget 118 is within reason, the budget-driven quotation 114 always delivers some form of a "Go" answer, but may deliver a "Go, with these changes" answer.

When part geometry is a modifiable variable, there are numerous ways in which the part geometry might be modifiable to reduce cost of the mold or part. In the case of an experienced moldmaker or machinist, the moldmaker or machinist often makes proposals as to numerous changes which could be made to reduce the cost. In the preferred system 114, the system 114 is also able to deliver numerous different suggestions, and makes an "educated guess" as to the feature(s) which should be first modified to reduce the cost sufficiently to meet the budget driven quotation. In this example, the rib 22 added an overly large portion of the cost because it required a tool change for the CNC machining, and thus was unusually expensive relative to the other features of the product. The software provides a quotation that meets the $3500.00 budget, but that graphically details to the customer that the thickness of the rib 22 has been increased as shown by modified rib 60.

The preferred budget driven quotation 114 provides for alternative selections of feature modifications which will result in meeting the budget 118. If the rib thickness cannot be increased and still achieve the functionality required by the designer, then the designer can look at a second alternative proposed by the system 114. In this example, a second proposed modification is to omit the groove 20 in its entirety. The software then permits the designer to page through different renditions of the budget driven quotation 114, such as by clicking on the "see next proposal" button, each page showing different proposed modifications to the part geometry, to determine whether any of the proposed modifications are acceptable.

Generally speaking, with no knowledge of part functionality, the part geometry modifications which are most likely to be proposed include increasing rib thickness, increasing groove thickness, increasing radius (on one or more corners), increasing draft, decreasing rib height and decreasing groove depth. With some knowledge of part functionality (which may be derived, for instance, by noting prior modification selections of that particular customer), more sophisticated proposals to modify part geometry can be developed.

The preferred budget driven quotation system 114 allows not only for alternative selections of feature modifications, but also simultaneously allows for proposed modification of menu-selected values. That is, the preferred budget driven quotation system 114 allows the software to suggest modifications to all of the various customer inputs (number of cavities or parts per workpiece block 102, A side finish 104, B side finish 106, material 108, lead time 110, lot size 116, and part geometry 20, 58, 60), and all combinations thereof. With multiple parameters which are subject to modification, the software must determine which parameters to modify and the order in which to suggest proposed modifications. In the preferred system 114, an algorithm is used to determine which parameters to modify and the order in which to suggest proposed modifications. For example, material selection 108 (for most materials, to other materials having similar properties), surface finish 106, 104, and number of cavities 102 are parameters which are programmed to be "readily changeable". If the budget 118 can be met by modifying one of these variables 102, 104, 106, 108, then the software will algorithmically select such alternatives and propose such modifications prior to any proposals which involve a "limited changeability" parameter. Delivery date 110 and part geometry modifications such as for rib 22 and notch 20 are selected to fall in a "limited changeability" category. The system will propose changes to delivery date 110 and/or part geometry 58 only if changes to material selection 108, surface finish 106, 104 and number of cavities or parts per workpiece block 102 do not result in an acceptable quotation 118. Lot size 116 and other features of part geometry 58 (part size, for instance) fall into a "rarely changeable" category, and make up the final attempts at modifications to make an acceptable quotation 114.

However, with the data generated based upon customer selection of proposed modifications, more sophisticated algorithms can be devised for determining which modifications to propose and the order of proposed modifications. For example, some customers are sensitive to material selection 108, other customers generally less so. If a particular customer has accepted a modification of material 108 to meet a budget driven quotation 114 in the past, then that customer is more likely to accept a modification of material proposal in the future. Accordingly, the algorithm for that customer is changed in accordance with previous selections. Another portion of the preferred algorithm involves a review of accepted modification parameters of other prior customers. If customer acceptance of a new, cheaper material is generally increasing, for instance, then the proposed change to that new material becomes a suggestion to make earlier in the proposed suggestion process. Yet a further portion of the preferred modification algorithm involves assessing how much a proposed change will affect the quotation price. Generally, a proposed change which affects the price of the quotation gradually is believed to be more likely to be accepted than a proposed change which affects a quotation price drastically. The preferred algorithmic selection is thus based upon the least significant change in price, so drastic changes to the customer inputs are proposed later in the process.

Yet a further portion of the preferred modification algorithm involves assessing the marginal revenue or marginal profit associated with a proposed change. If no competition existed, a uniform profit margin could be charged for all jobs. However, competition will at times drive profit margins for certain types of jobs down, while profit margins for other types of jobs remain healthy. As an example, a moldmaker may have a healthy profit margin for all milled machining processes, but a lower profit margin for EDM'd features on the mold 86. The preferred modification algorithm may thus first propose modifications so that features may be milled rather than EDM'd, even if both milling and EDMing result in the same price. That is, with other factors being equal, the system 114 proposes higher margin alternatives prior to suggesting lower margin alternatives.

At the same time, when the mold 86 can be manufactured by alternative methods (milling versus EDMing, polishing versus laser finishing, etc.), the preferred system 114 proposes all of the alternative manufacturing methods for the mold to the customer, and merely orders the presentation of the alternatives to the customer with the "best" alternative first.

In a similar vein, a part manufacturer may propose lower margin limited volumes, such as by total profile machining a single part, in the hopes that acceptance of the design provided by total profile machining will result in another order, with this subsequent order including a higher margin molding of the part in higher volume. This "foot in the door" aspect can be further added to the algorithm used in quoting jobs.

While the preferred algorithmic selection of proposed modifications provides amazing results for many customers on many projects and leads to a higher acceptance of quotations, no algorithm is appropriate for all customers on all projects. For example, for certain customers on certain projects, modification of the material 108 to be used in molding the part 10 may not be an option. The preferred system thus allows the customer to fix one or many of the variables in the budget driven quotation process. If the customer clicks that the material 108 should be constrained to black ABS, then the proposed modifications will not include any changes to material, but will only make proposals to change the other cost affecting parameters to meet the budget 118.

Figure 15:
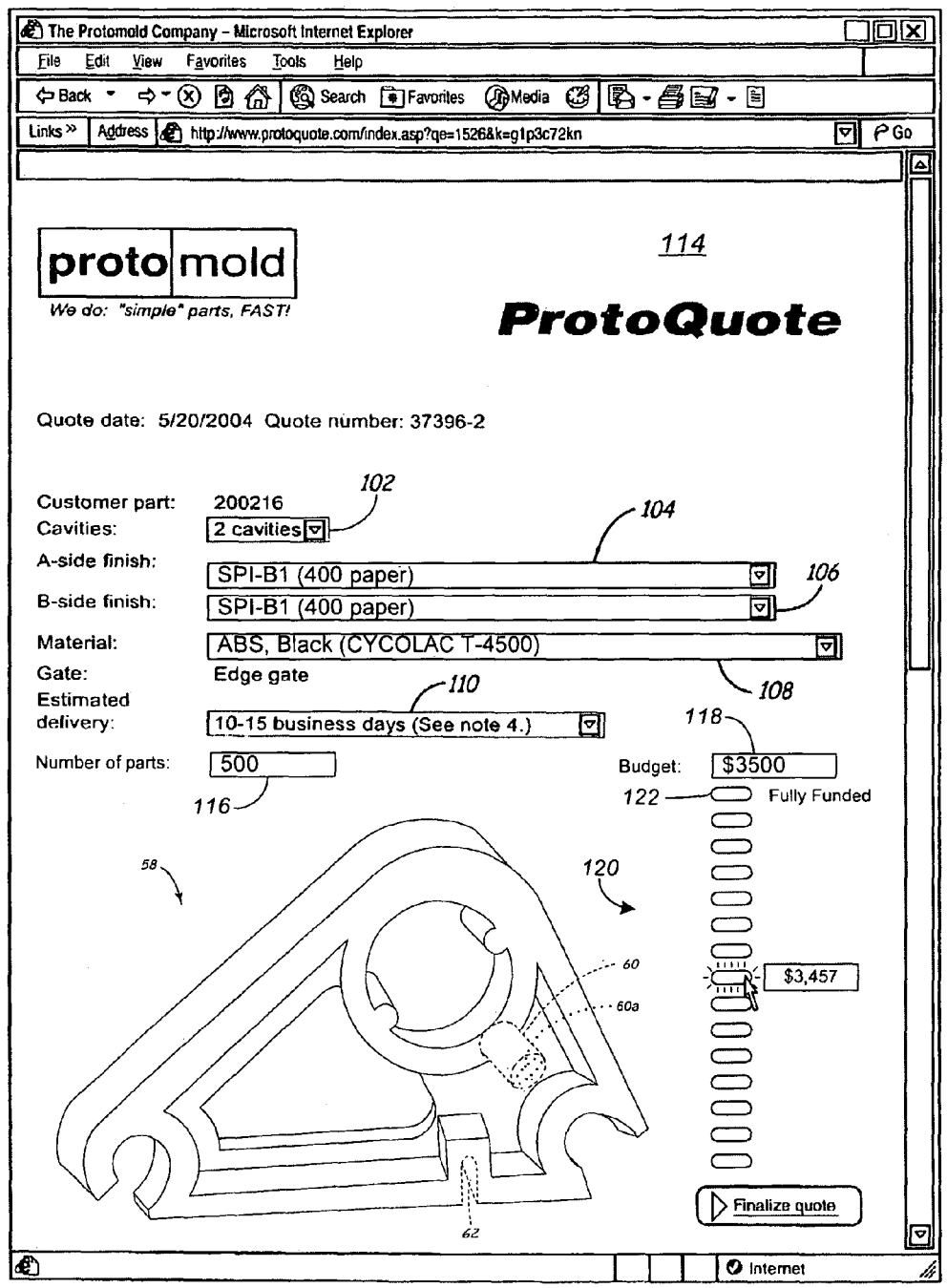
FIG. 15 is a computer screen shot of another preferred customer interface for the quotation system, showing a dropdown slide bar index for dollar value of the quotation relative to a graphical rendering of how the part is proposed to be modified to meet the dollar value quoted.

With the system providing proposed modifications to the customer, additional new content can be provided to the customer to assist in the design and quotation process. One of the most powerful forms of new content that can be provided to the customer involves interactivity in the design and quotation process. A particular example of interactivity achieved by the present invention, shown with reference to FIG. 15, involves the budget driven or reverse quotation process, or a similar quotation process that involves changing parameters to achieve a desired quotation. In this example, the budgeted price ($3500 in the prior example) is a parameter which the customer can control, to see proposed changes to the design in an interactive way. With sufficient software sophistication of the algorithmic selection of proposed modifications, the way in which design changes affect price can be interactively and graphically shown to the customer. In this example, for instance, the thickness of the rib 22 is determined to be a first proposed modification variable. Other menu driven parameters, such as type of material, are constrained while the customer is using price as the interactive variable. A scroll bar, slide bar or similar graduated index 120 is provided for the pricing variable. The customer clicks and pulls the index 120 to see on-screen the proposed changes to the part geometry 58. For instance, with the index 120 on $3457, the thickness of the rib 22 is highlighted as shown in dashed lines 60, depicted at 180% of design value. If the customer clicks and pulls the slide bar 120 higher, the thickness of the rib 22 decreases, as shown in dotted line 60a, and a different numeric value for the quotation is shown along the slide index 120. The customer can decrease the thickness of the rib 22 until it reaches a 100% of design, fully funded value 122. If the customer clicks and pulls the slide bar 120 lower, the thickness of the rib 22 increases and the height of the rib 22 decreases until the rib 22 is gone. If further decreases in price are required, then the shown image morphs by changing the next proposed modification feature, the depth of the recess 20, to a changed value 62. If the customer desires, the customer can constrain one proposed modification feature (setting the thickness of the rib 22 to a 120% of design value, for instance), and the slide bar index 120 will immediately change to a price modification controlling the next feature variable (the depth of the recess 20). As price is clicked and pulled by the customer higher, ribs may morph getting taller, recesses may morph getting deeper, and radiused corners may morph getting sharper. With interactivity graphically added in this powerful way, the customer readily sees how differences in part geometry affect the price of the quotation.

In the preferred interactive system, only the drop down slide bar 120 for the price variable affects the graphical rendering 58 of the proposed modification part. The other variables, such as material, are also provided with drop down slide bars (not shown); the interactive change caused by the non-price slide bars is not to the graphical rendering 58 of the part on screen, but rather only to the quotation price 118. Thus, the customer can instantaneously see, by controlling the drop-down material selection slide bar, how the selection of material changes the quotation for a given part geometry. Once the customer selects a new material, then the customer can instantaneously see, by controlling the drop down price slide bar for example, how controlling the pricing will permit different features to be designed into the part. The quotation 114 allows the customer to go back into the budget driven mode at any point during modification of the other variables. Once the modifications to part geometry are at a point that the customer likes them, the customer can again turn to modifying other variables, seeing for instance how changes in surface finish affect the cost of the newly shaped part with the new material. The customer can control selection of each variable in turn, until the perfect quotation and part geometry design is achieved for that part.

In an alternative preferred embodiment to having the customer provide the CAD file offsite to obtain a quotation, a significant portion of the software for the system, including at least the Customer Data Input module 30, is provided to the customer for the customer to download or install on the customer's computer 34. By having the Customer Data Input module 30 reside on the customer's computer, it may not be necessary for the customer to send the customer's CAD file to the moldmaker or machinist during the quoting portion of the system. Because the transmission of the CAD file to the Customer Data Input module 30 occurs entirely within the customer's computer, the entire quotation process can take place without the risk of interception of the customer's CAD file either in the mail or over the internet. CAD files typically contain a substantial amount of data, and delay involved in transmitting CAD files may be reduced. Locating all or part of the software on the customer's PC may accordingly speed the processing time.

The alternative preferred embodiment, however, still involves real time communication of at least some data to and from the moldmaker's or machinist's computer system. At a minimum, cost parameters are communicated to the customer's computer 34, so any quotation given is up to date and current. More preferably, data about each quotation sought is communicated to the moldmaker/machinist, so the moldmaker/machinist may monitor the customer's decision-making process, and thereby improve or customize future versions of the software for that particular customer.

The next part of the preferred embodiment involves the tool selection and tool path computation module 68. The tool selection and tool path computation module 68 may be activated upon receipt of an accepted quotation 66, but more preferably operates in conjunction with the quoting module 64 as discussed earlier. The task of the tool selection and tool path computation module 68 is to determine what tools to use and what tool paths should be used with those tools to efficiently manufacture the mold or machine the part specified by the CAD file 32 of the customer.

As an initial step for a molded part, the predicted shrinkage 70 of the plastic material upon solidification is applied to the CAD file 32. Based upon the plastic material that the customer indicates will be used to the customer data input module 30, the dimensions are increased in accordance with known shrinkage factors. Subsequent calculations in the tool selection and tool path computation module 68 are based upon the size of the cavity (before shrink, as determine by a shrinkage factor 70) rather than size of the part 10 (after shrink).

As a second initial step, standard mold or workpiece block sizes are assessed to determine mold or part block layout 72. Mold layout 72 is the process of assigning and locating one or more core/cavities onto a standardized mold base. Total profile machined part layout 72 is the process of assigning and locating one or more parts relative to a standardized workpiece block size. For small, simple parts, two or more identical cavities may be machined into a standard sized mold block, and two or more identical parts may be machined from a standard sized workpiece block. A family mold or family block layout contains more than one unique part, and is often used to reduce tooling cost for a group of parts that are used together. A multi-cavity mold or multi-part layout usually refers to a mold or workpiece block with multiple copies of the same part. This approach is commonly used to reduce per part costs when expected production volume will be significant. Either or both approaches may be utilized using the present invention. Selecting one of several standard mold base sizes determines the size of the raw block of aluminum from which the mold will be formed. One of several standard workpiece block sizes can also or alternatively be selected. If the automatic quoting module 64 is used, information about which standard size block is to be used and the number of parts as selected in the layout 72 is fed back to the automatic quoting module 64.

Before any selection of tools and computations of tool paths can be performed, the orientation of the part relative to the block must be determined. While this could be performed manually by an experienced moldmaker or machinist, the preferred automated method was described earlier with reference to automatic "straight pull" single axis manufacturability identification 40 as one of the acceptability criteria.

Once the orientation of the part relative to the block is determined, the parting line and corresponding shutoff surfaces are selected 74 for a molded part, and/or the tooling orientation separation line is determined for a total profile machined part.

The parting line and corresponding shutoff surfaces should be oriented with respect to the part to permit straight pull of the first half and the second half in a straight-pull z-direction during molding of the part. Again, selection of the parting line and corresponding shutoff surfaces could be performed manually by an experienced moldmaker. In the preferred embodiment, the parting line and corresponding shutoff surfaces are automatically oriented 74 with respect to the part 10 as follows.

The CAD file 32 is assessed to automatically determine all edge surfaces which extend parallel to the straight-pull z-direction. For a moment, the parallel edge surfaces are excluded from the determination, as determining the parting line for the other portions of the part 10 is relatively easy. If an edge surface does not extend parallel to the straight-pull z-direction, then the parting line is at the height of the greatest areal extent of the part. Thus, the parting line/shutoff surface portion 74 of the tool selection and tool path computation module 68 automatically defines parting line segments which extend along the uniquely (non z-direction) extending greatest periphery of the part 10. If an edge surface does not extend parallel to the straight-pull z-direction, then the parting line is at the height of the greatest areal extent of the part. The cam 10 has no uniquely (non z-direction) extending periphery of the part, as the part outline flange 12, the circular opening 14, the two rotation pins 16, the non-circular opening 18, the notch 20, the 60° corner hole 24, the 30° corner hole 26, and the partial web 28 all provide edge surfaces which extend in the z-direction.

The unique parting line segments (if any) must now be connected within the edge surfaces which extend parallel to the straight-pull z-direction. Preferably, the parting line selection routine 74 uses the CNC machining criterion 42 and verifies potential z-direction heights of the parting line segments within the parallel edge surfaces, to assure that the selection of the parting line comports with the desired machinability of the mold. For instance, if tool 50 is being used to machine the bottom mold block at a parallel edge surface of the part outline flange 12, and if tool 50 has a cutting depth 52 of two inches, then the parting line segment must be within the bottom two inches of the parallel edge surface of the part outline flange 12.

Once any unique parting line segments are defined and the CNC machining criterion 42 is verified, the parting line selection routine 74 can use any of several optimization routines. For the shortest parting line, the parting line segments within the parallel edge surfaces simply connect the unique and CNC defined parting line segments. To the extent possible, the parting line should be designed to be no steeper than 5-10 degrees. Preferably, a smoothing routine is used to define curved parting line segments within the parallel edge surfaces. In the preferred embodiment, a second derivative of the parting line (i.e., the instantaneous change in slope of the parting line) is minimized in conjunction with minimizing the length of the parting line.

Shutoff surfaces within the mold are automatically determined in much the same way. The shutoff surfaces are those surfaces where the mold halves will contact each other when the mold is closed. First, the shutoff surfaces by definition include the parting line. If the parting line is planar, with no holes inside the part, the shutoff surface is defined to be coplanar with the parting line. In the case of the cam 10, the circular opening 14 and the non-circular opening 18 also represent areas of contact between the shutoff surfaces for the two parts of the mold. The parting line around the part outline flange 12, the parting line around the circular opening 14 and the parting line around the non-circular opening 18 can each be planar. The shutoff surface at the circular opening 14 can be planar, as can the shutoff surface at the non-circular opening 18. Defining the shutoff surfaces can be very complex in the case of a part with a highly articulated parting line and complex internal telescoping shutoffs. Beyond considering the parting line, the preferred embodiment 74 optimizes the selection of the shutoff surfaces. To the extent possible, the shut-off surfaces should be designed to be no steeper than 5-10 degrees. While a straight-line routine could be used, the preferred embodiment uses a three-dimensional smoothing routine.

The preferred smoothing routines create a parting line shutoff surface which is mathematically complex, and virtually impossible to hand machine. However, the complex surface is mathematically defined, and translated into CNC machining instructions. In the CNC machining instructions, the mathematical complexity of the curve is not particularly important. What is important in the CNC machining instructions is that the shut off surfaces are as smooth as possible, and thus can be formed with the largest tool(s) possible and at the fastest material removal rates. Automatic selection 74 of the parting line and corresponding shutoff surfaces thus provides for: (a) a fast assessment of acceptability criterion 42; (b) a fast quotation 66; (c) a fast generation of CNC machining instructions 76; and (d) a fast CNC machining operation 78 to fabricate the mold.

After the parting line and the shutoff surfaces 74 are determined, the preferred method uses the geometry analyzer module 38 to automatically determine the tools and material removal steps required to form the cavity or cavities, or to total profile machine the part. The cavity or part profile is split in two parts, one for the top and the other for the bottom. In contrast to the shutoff surfaces, which are defined identically but opposite for the two mold blocks, the cavity obviously may have different top and bottom shapes. For each of the two cavity or part surfaces, the geometry analyzer module 38 generates a cloud of points dense enough to represent the part geometry with acceptable tolerance. For each point in the cloud, the geometry analyzer module 38 traverses the set of machining tools available. That is, a collection of information of standard tool geometries and surface profiles machinable by each of the standard tool geometries is created and stored in the program 38. Because we have already defined the system constraints to include straight-pull single axis manufacturability 40, the preferred collection of information is only considered in the CNC machine with the block oriented relative to the tool in the straight-pull z-direction. This stored information is considered by the geometry analyzer module 38 to determine which tools are available to machine a small vicinity of each point without gouging more distant parts of the partial surface either with the tip or shank of the tool 50 or with the collet 54 holding the tool 50. The tool information is traversed starting from the most efficient (fastest material removal, lowest cost) tool and going in the direction of decreasing tool efficiency. The traversal is stopped when several tools that can machine the current point without gouging are found. The association between the points and the identified most effective non-gouging tools is stored in the memory.

If, for the current point, a non-gouging tool could not be found at all, this fact is also stored in memory. The failure to find a non-gouging tool can then be used as the basis for the proposed modification CAD file communication module 56 discussed earlier.

For the collection of points which can be machined, the geometry analyzer module 38 uses a tool selection optimization routine 80 which selects the most efficient tool. In general, the collection of machinable points should be machined with as few tool changes as possible, but still at the highest rate of material removal. The tool selection and tool path computation module 68 automatically identifies and locates discrete machinable portions of the part surface profile which can be machined with a single tool 50, and records the most efficient tool path for that tool 50.

As noted earlier, the preferred tools used in the CNC machining process most commonly include standard-sized endmills. For instance, much of the surface profile for the cavity for the cam 10 can be efficiently machined with the ¼ endmill 50. FIG. 16 is a "screen-shot" representing a portion of an optimized tool path 82 generated so as much of the cavity 84 as possible for the cam 10 can be machined by CNC machining with the ¼ endmill 50.

The preferred tool selection and tool path computation module 68 determines the other portions of the block 86 as well. In particular, the preferred tool selection and tool path computation module 68 for a molded part automatically identifies 88 sizes and locations of ejector pins 90, as shown in FIG. 17. Ejector pins 90 are used to push the part 10 out of the mold 86 after it has been formed. In general, ejector pin selection 88 considers the profile of the mold 86 to determine the deepest locations which provide significant surface area extending perpendicular to the straight-pull z-direction. The ejector pin selection routine 88 centers ejector pin locations on these flat surfaces, and sizes the ejector pins 90 by selecting the largest standard size that will fit within each flat surface.

Figure 10:
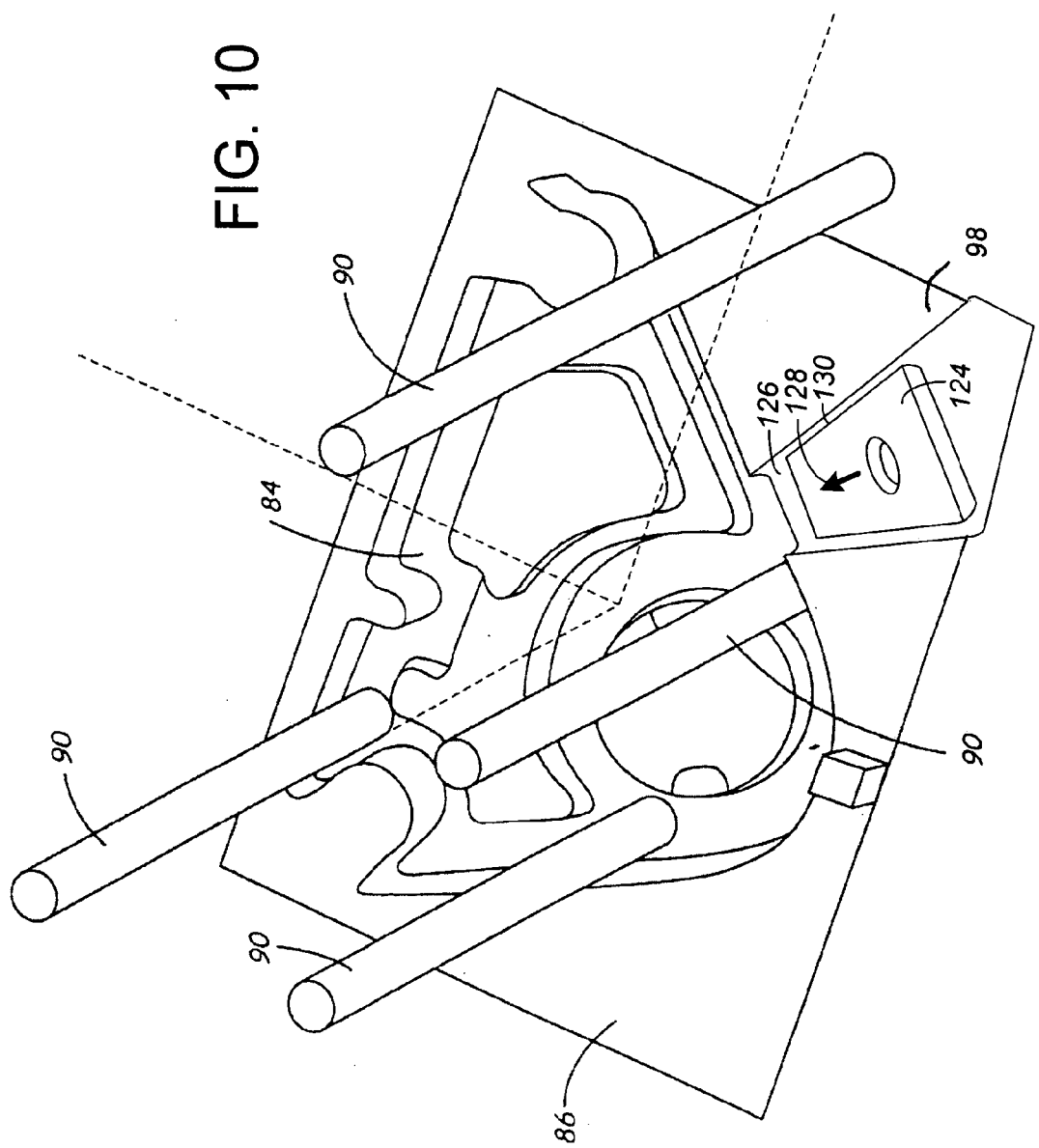
FIG. 10 is a perspective view showing a permissible side action in a mold for the part.

The preferred tool selection and tool path computation module 68 also identifies and positions side actions 124 as shown in FIG. 10. A side action recess 126 is positioned in part of the mold block 86. The side action slide direction 128 and the angle of the interface 130 of the side action 124 relative to the slide direction 128 is defined. In the basic side action positioning algorithm, the side action 124 is selected at a position where it will not interfere with any part features, with the edge of the mold block 68, or with any ejector pin placement locations 90, and then centered with regard to closest interference positions. However, the side action positioning algorithm can also allow manual adjustment of the side action position and direction, or include assessment of other features to determine how to best position and size the side action 124. Once the side action position, size and slide direction 128 are set, the preferred tool selection and tool path computation module 68 calculates both tool paths for the side action recess 126 and tool paths to machine the side action 124 itself out of a separate block of metal.

The preferred tool selection and tool path computation module 68 also automatically identifies 92 sizes and locations of runners 93 and gates 94, as shown in FIG. 18. A gate 94 is the place on the mold 86 where the plastic is injected into the mold cavity 84 as a part is being produced. A runner 93 is the path on the mold 86 where the molten plastic travels to get from the molding machine to the gate(s) 94 and into the part cavity 84. The sizes of runners 93 and gates 94 are selected 92 from knowledge of standard cutting tool sizes, based upon the plastic material selected by the customer, the volume of the part, and the known flow constraints of that plastic material. The locations of the gates 94 are generally selected 92 to connect to the part 10 on a surface which extends parallel to the z-direction, and to minimize seam lines in the part 10 based upon flow geometry. The locations of the runners 93 are generally selected 92 to be as straight as possible from the sprue location 96 to the gates 94.

Once the separation line or parting line and shutoff surfaces 98 have been defined (step 74), the mold/part layout including any side actions or side tooling orientations has been specified 72, the tools have been selected 68, and the tool paths for the cavity 84 or part 10 have been computed 80, the preferred method includes a CNC instruction generation module 100 which generates the detailed instructions 76 that will be used by the CNC milling equipment to cut the mold 86 from a raw block of aluminum or to cut the part 10 from a raw block of workpiece material. The CNC instruction generation module 100 generates a series of CNC machining instructions 76 corresponding to machining the mold 86 or part 10 with the selected tools and computed machining actions. For instance, the CNC instruction generation module 100 may generate a "g-code" program containing a set of instructions 76 for CNC milling machines. If desired, the shape of the cavity 84 or part 10 as machined in the block can be visualized with one of the g-code viewers developed for up-front visual verification of machining under the control of g-code programs, and the shape of the cavity 84 or part 10 can be visually compared with drawings of the part 10. For molded parts, CNC machining instructions 76 are generated to machine ejector pin locations 90, sprues 96, runners 93, gates 94 etc. into the mold blocks.

The final step in the preferred process is machining 78 the mold 86 or the total profile of the part 10. For molded parts, the shutoff surfaces 98 are machined into the mold blocks with the selected tools and computed machining actions and via the computer generated series of CNC machining instructions 76. The cavity 84 is likewise machined into the first and second halves of the mold 86. Locations for ejector pins 90 are machined into the first and second halves of the mold 86 via the computer generated series of CNC machining instructions 76, as are runners 93 and gates 94.

If the accepted quotation 66 involves a piece price quotation, the number of pieces ordered by the customer are either directly machined or run in an injection mold press. The pieces are shipped back to the customer. The customer is billed in accordance with the quotation 66.

The present invention allows mass production techniques to be used in the moldmaking and/or part machining process, even though every part and every mold is custom designed, custom machined and different.

Although the present invention has been described with reference to preferred embodiments, workers skilled in the art will recognize that changes may be made in form and detail without departing from the spirit and scope of the invention. As one example, while the present invention has been described with relation to various patentable features being performed in separately named modules, computer programmers will recognize many equivalent options exist for naming of the modules and organization of the programming features. As another example, while one aspect of the present invention as described is constrained to require straight-pull, two-piece molds or parting-line-intersecting side actions, enhancements may be made to support submersed side actions in the mold, or multi-axial assembly molds. Permitting submersed side action molds and multi-axial assembly molds will thus increase the percentage of parts that are eligible for the automated process.

The invention claimed is:

1. A method of automated, custom quotation for manufacture of a part, the method comprising:
- receiving a CAD file for the part to be manufactured, the CAD file defining a part surface profile;
- assessing cost-affecting parameters of CNC machining the part surface profile;
- providing the customer with at least one menu of customer-selectable values for a cost-affecting parameter of manufacture unassociated with part surface profile;
- allowing the customer to select one of the provided customer-selectable values;
- computer generating a quotation for part manufacture based in part upon the cost-affecting parameters of CNC machining the part surface profile and based in part upon the customer-selected value; and
- transmitting the computer generated quotation to the customer.

2. The method of claim 1, wherein the menu is provided over the internet and the computer generated quotation is transmitted over the internet.

3. The method of claim 1, wherein the assessing of cost-affecting parameters for machining the part surface profile is for machining of a mold having a cavity corresponding to a shape of the part surface profile.

4. The method of claim 1, wherein the assessing of cost-affecting parameters for machining the part surface profile is for direct total profile machining of the part from a workpiece material block.

5. The method of claim 1, wherein the quotation comprises both direct total profile machining of one or more parts from workpiece material in low volume, and machining of a mold having a cavity corresponding to a shape of the part surface profile for higher volume.

6. The method of claim 1, wherein the at least one menu of customer-selectable values for a cost-affecting parameter of manufacture unassociated with part surface profile comprises a menu of available materials from which the part can be made, such that the automatically generated quotation varies based upon which material the customer selects for the part.

7. The method of claim 6, wherein the menu of available materials comprises at least one material from which the part can be total profiled machined but which is not offered for molding of the part.

8. The method of claim 1, wherein at least one menu of customer-selectable values for a cost-affecting parameter of manufacture unassociated with part surface profile comprises a menu of possible surface finishes, such that the automatically generated quotation varies based upon which surface finish the customer selects for the part.

9. The method of claim 1, wherein at least one menu of customer-selectable values for a cost-affecting parameter of manufacture unassociated with part surface profile comprises a menu of number of parts in a production run, such that an average piece price varies based upon how many parts the customer selects to be run.

10. The method of claim 1, wherein the automatically generated quotation comprises a series of piece price quotations covering different lot sizes, the an average piece price varying based upon how many parts the customer selects to be run.

11. The method of claim 1, wherein at least one menu of customer-selectable values for a cost-affecting parameter of manufacture unassociated with part surface profile comprises a menu of potential delivery times, such that the computer generated quotation varies based upon lead time required by the customer.

12. The method of claim 1, wherein the act of assessing cost-affecting parameters of CNC machining the part surface profile comprises: computer generating a series of CNC machining instructions corresponding to machining the part surface profile, wherein the automatically generated quotation is based upon the computed CNC machining instructions.

13. The method of claim 1, wherein the act of assessing cost-affecting parameters of CNC machining the part surface profile comprises: automatically identifying an estimated duration of material removal required for each discrete portion of the part surface profile, and wherein the computer generated quotation varies based upon a total of estimated durations of material removal.

14. The method of claim 1, wherein the act of assessing cost-affecting parameters of CNC machining the part surface profile comprises: computer identification of the number and type of tools to be used in selected material removal steps for the part surface profile, and wherein the automatically generated quotation varies based upon the number and type of tools to be used in selected material removal step.

15. The method of claim 1, wherein the act of assessing cost-affecting parameters of CNC machining the part surface profile comprises computer assessment of amount, depth and steepness of ribbing required for the part, and wherein the automatically generated quotation varies based upon the required amount, depth and steepness of ribbing.

* * * * *